US007535010B2

(12) United States Patent
Saito et al.

(10) Patent No.: US 7,535,010 B2
(45) Date of Patent: May 19, 2009

(54) SENSOR AND IMAGE PICKUP DEVICE

(75) Inventors: Keishi Saito, Tokyo (JP); Hideo Hosono, Yokohama (JP); Toshio Kamiya, Yokohama (JP); Kenji Nomura, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 0 days.

(21) Appl. No.: 11/937,259

(22) Filed: Nov. 8, 2007

(65) Prior Publication Data

US 2008/0251729 A1 Oct. 16, 2008

Related U.S. Application Data

(63) Continuation of application No. 11/269,648, filed on Nov. 9, 2005, now Pat. No. 7,453,065.

(30) Foreign Application Priority Data

Nov. 10, 2004 (JP) ............................. 2004-326681

(51) Int. Cl.
*G01T 1/24* (2006.01)
(52) U.S. Cl. .............................. 250/370.09; 250/370.11
(58) Field of Classification Search ............ 250/370.09, 250/370.11
See application file for complete search history.

(56) References Cited

U.S. PATENT DOCUMENTS

| | | | | |
|---|---|---|---|---|
| 5,117,114 A | * | 5/1992 | Street et al. | 250/370.11 |
| 5,578,814 A | | 11/1996 | Dadali et al. | 257/66 |
| 6,075,256 A | | 6/2000 | Kaifu et al. | 257/53 |
| 6,649,915 B2 | | 11/2003 | Wright et al. | 250/370.13 |
| 7,189,992 B2 | | 3/2007 | Wager, III et al. | 257/43 |
| 2002/0011572 A1 | | 1/2002 | Kajiwara et al. | 250/370.11 |
| 2003/0013008 A1 | | 1/2003 | Ono | 429/111 |
| 2003/0218222 A1 | | 11/2003 | Wager et al. | 257/430 |
| 2005/0173734 A1 | | 8/2005 | Yoshioka et al. | 257/202 |
| 2006/0110867 A1 | | 5/2006 | Yabuta et al. | 438/151 |
| 2006/0113536 A1 | | 6/2006 | Kumomi et al. | 257/59 |
| 2006/0113565 A1 | | 6/2006 | Abe et al. | 257/197 |

FOREIGN PATENT DOCUMENTS

| | | |
|---|---|---|
| JP | 08-032094 | 2/1996 |
| JP | 2003-298062 | 10/2003 |
| WO | WO 03-098699 | 11/2003 |

(Continued)

OTHER PUBLICATIONS

Nomura, et al; "Room-Temperature fabrication of . . . amorphous oxide semiconductors". Nature, vol. 432, 488-492 (2004).

(Continued)

*Primary Examiner*—David P Porta
*Assistant Examiner*—Mark R Gaworecki
(74) *Attorney, Agent, or Firm*—Fitzpatrick, Cella, Harper & Scinto

(57) ABSTRACT

A sensor for detecting a received electromagnetic wave comprising a first electrode, a second electrode and an amorphous oxide layer interposed between the first electrode and the second electrode.

4 Claims, 9 Drawing Sheets

FOREIGN PATENT DOCUMENTS

| | | |
|---|---|---|
| WO | WO 2004/038757 | 5/2004 |
| WO | WO 2005-088726 | 9/2005 |
| WO | WO 2005/093846 | 10/2005 |
| WO | WO 2005/093847 | 10/2005 |
| WO | WO 2005/093848 | 10/2005 |
| WO | WO 2005/093849 | 10/2005 |
| WO | WO 2005/093850 | 10/2005 |
| WO | WO 2005/093851 | 10/2005 |
| WO | WO 2005/093852 | 10/2005 |
| WO | WO 2006-051993 | 5/2006 |
| WO | WO 2006/051994 | 5/2006 |
| WO | WP 2006-051995 | 5/2006 |

OTHER PUBLICATIONS

Takagi, et al.; "Carrier transport and . . . amorphous oxide semiconductor, a-InGaZnO$_4$"; Thin Solid Films, vol. 486, 38-41 (2005).

Nomura, et al; "Thin-Film Transition . . . Oxide Semiconductor"; Science, vol. 300, 1269-1272 (2003).

* cited by examiner

SENSOR AND IMAGE PICKUP DEVICE

BACKGROUND OF THE INVENTION

1. Field of the Invention

The present invention relates to a sensor for detecting a received electromagnetic wave such as an optical sensor, a solar cell, or an X-ray sensor.

The present invention also relates to a non-flat image pickup device.

2. Related Background Art

The development of a thin film transistor (TFT) using an oxide semiconductor thin film containing ZnO has been vigorously conducted (Japanese Patent Application Laid-Open No. 2003-298062).

The thin film can be formed at a low temperature, and is transparent with respect to visible light. Accordingly, a flexible and transparent TFT can be formed on a substrate such as a plastic plate or a film. In addition, attempts have been made to use ZnO for an optical sensor and a solar cell.

Meanwhile, there are tubes that are complicatedly laid in an atomic power plant or the like.

In addition, much cost and time have been spent for inspecting the corroded states and the like of the tubes. Therefore, a non-flat X-ray imager (image pickup device) that can be inserted into a gap between the complicated tubes has been desired.

In the medical field, at present, a large burden has been applied to a patient in X-ray diagnosis by means of mammography or the like. A non-flat X-ray imager as means for X-ray diagnosis imposing a reduced burden to a patient has been desired.

A non-flat imager is generally constituted by a thin film transistor and an X-ray sensor. The thin film transistor (TFT) is a three-terminal device equipped with a gate terminal, a source terminal, and a drain terminal. The TFT is combined with a sensor to be used as a switch for selecting a sensor or as an amplifier.

A more flexible one having better performance has been requested as a sensor for detecting an electromagnetic wave or a non-flat X-ray image pickup device.

SUMMARY OF THE INVENTION

An object of the present invention is to provide a novel sensor or image pickup device using an amorphous oxide.

Another object of the present invention is to provide a sensor or non-flat image pickup device using an amorphous oxide having an electron carrier concentration of less than $10^{18}/cm^3$ or an amorphous oxide whose electron mobility tends to increase with increasing electron carrier concentration.

Another object of the present invention is to provide an image pickup device comprising an X-ray sensor and a normally-off field effect transistor.

The sensors for detecting a received electromagnetic wave in the present invention includes, of course, an optical sensor, and a sensor for detecting non-visible light such as an ultraviolet optical sensor and a sensor for detecting a radiant ray such as an X-ray sensor.

Hereinafter, the present invention will be described specifically.

According to one aspect of the present invention, there is provided a sensor for detecting a received electromagnetic wave, including a first electrode; a second electrode; and an amorphous oxide layer interposed between the first electrode and the second electrode.

It is desirable that the amorphous oxide layer has an electron carrier concentration of less than $10^{18}/cm^3$.

The first electrode desirably has transmissivity with respect to light in a wavelength range to which the amorphous oxide layer is sensitive.

The present invention also includes a sensor in which the amorphous oxide layer has an organic pigment.

According to another aspect of the present invention, there is provided a sensor including a first electrode; a second electrode; and an amorphous oxide semiconductor layer interposed between the first electrode and the second electrode, in which the amorphous oxide layer is an amorphous oxide whose electron mobility tends to increase with increasing electron carrier concentration.

According to another aspect of the present invention, there is provided an image pickup device including:

a flexible substrate;

an X-ray sensor arranged on the flexible substrate; and a field effect transistor electrically connected to the X-ray sensor, in which:

the field effect transistor has an amorphous oxide semiconductor as an active layer; and the amorphous oxide semiconductor has an electron carrier concentration of less than $10^{18}/cm^3$ or is an oxide whose electron mobility tends to increase with increasing electron carrier concentration.

In particular, the image pickup device more preferably has a non-flat imaging region.

The present invention also includes a non-flat imager in which the X-ray sensor includes a scintillator for converting X-ray into light and an opto-electric conversion element.

The present invention also includes an image pickup device, wherein the X-ray sensor comprises a semiconductor layer, and the semiconductor layer also comprises an amorphous oxide.

According to another aspect of the present invention, there is provided an image pickup device comprising:

a substrate having a non-flat region;

an X-ray sensor provided on the substrate; and a field effect transistor for reading a signal from the X-ray sensor, wherein the field effect transistor is a normally-off transistor having an active layer composed of an amorphous oxide.

By the way, in general, an inorganic thin film transistor is formed on a flat surface and is used in a flat shape. A conventional inorganic thin film transistor typified by amorphous silicon requires a high-temperature process for its formation, and it has been difficult to form such transistor on a flexible substrate such as a plastic resin.

Investigation has been made into a thin film transistor using an organic semiconductor such as pentacene as a thin film transistor that can be formed on a flexible substrate. However, the characteristics of the transistor have not been sufficient yet.

Recently, as described above, the development of a TFT using a polycrystalline oxide of ZnO for a channel layer has been vigorously conducted.

The inventors of the present invention have made investigation into an oxide semiconductor. As a result, they have found that ZnO cannot generally form a stable amorphous phase. In addition, most ZnO shows a polycrystalline phase. Therefore, a carrier is scattered at an interface between polycrystalline particles, with the result that an electron-mobility cannot be increased.

In addition, an oxygen defect is apt to enter ZnO. As a result, a large number of carrier electrons are generated, so it is difficult to reduce an electric conductivity. It has been found that, owing to the foregoing, even when no gate voltage is applied to a transistor, a large current flows between a source terminal and a drain terminal, so a normally-off operation of a TFT cannot be realized. It seems also difficult to increase on-off ratio of the transistor.

In addition, the inventors of the present invention have examined an amorphous oxide film $Zn_xM_yIn_zO_{(x+3y/2+3z/2)}$ (where M represents at least one element of Al and Ga) described in Japanese Patent Application Laid-Open No. 2000-044236. The material has an electron carrier concentration of $10^{18}/cm^3$ or more, so it is suitable for a mere transparent electrode.

However, it has been found that, when an oxide semiconductor having an electron carrier concentration of $10^{18}/cm^3$ or more is used for a channel layer of a TFT, sufficient on-off ratio cannot be secured, so the oxide is not appropriate for a normally-off TFT.

That is, a conventional amorphous oxide film has been unable to provide a film having an electron carrier concentration of less than $10^{18}/cm^3$.

In view of the foregoing, the inventors of the present invention have produced a TFT using an amorphous oxide having an electron carrier concentration of less than $10^{18}/cm^3$ for an active layer of a field effect transistor. As a result, they have obtained a TFT having desired characteristics, and have discovered that the TFT is applicable to an image display device such as a light-emitting device.

The inventors of the present invention have conducted vigorous research and development concerning $InGaO_3(ZnO)_m$ and conditions under which the material is formed into a film. As a result, they have found that an electron carrier concentration of less than $10^{18}/cm^3$ can be achieved by controlling the conditions of an oxygen atmosphere upon film formation.

The present invention relates to a sensor or image pickup device using a film that has realized a desired electron carrier concentration.

According to the present invention, there are provided a novel sensor and a novel image pickup device.

In particular, when a measuring object is subjected to X-ray transmittance measurement by means of a non-flat imager, an image having reduced distortion as compared to a flat imager can be obtained.

In addition, when a human body is subjected to X-ray measurement, a physical burden imposed on the measuring person is reduced.

DETAILED DESCRIPTION OF THE PREFERRED EMBODIMENTS

The present invention relates to a sensor and a non-flat imager each using an amorphous oxide. Hereinafter, an optical sensor will be described in detail in a first embodiment, and then a non-flat imager will be described in a second embodiment.

After that, an amorphous oxide common to both the embodiments and the properties of the amorphous oxide will be described in detail.

First Embodiment

Figure 8:
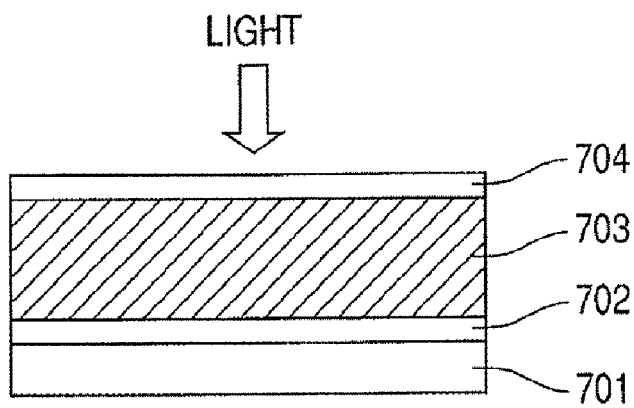
FIG. 8 is a schematic explanatory view showing a first example of the optical sensor of the present invention.

FIG. 8 shows a first schematic structural view of a sensor for detecting a received electromagnetic wave according to the present invention.

The sensor according to the present invention is constituted of a lower electrode (702), an amorphous oxide semiconductor layer (703), and an upper electrode (704) on a substrate (701).

The upper electrode may be referred to as the first electrode, and the lower electrode may be referred to as the second electrode.

In this embodiment, for example, an oxide having an electron carrier concentration of less than $10^{18}/cm^3$ is used for the amorphous oxide layer.

The thickness of the amorphous oxide semiconductor layer, which is appropriately optimized depending on the wavelength of light with which the layer is irradiated or a pigment for pigment sensitization, is preferably 10 nm to 1·m, or more preferably 10 nm to 500 nm.

The amorphous oxide semiconductor shows n-type conduction when it is a semiconductor containing In—Ga—Zn—O. It is also preferable to form a junction between the amorphous oxide semiconductor and a metal having a large work function such as Pt to constitute a photodiode. The oxide semiconductor as an n-type oxide semiconductor and $SrCu_2O_2$ as a p-type oxide semiconductor may be laminated to form a semiconductor junction, thereby constituting a photodiode.

Of course, the sensor according to the present invention can be used as an optical sensor for ultraviolet light or for X-rays. In addition, the sensor can be used as an optical sensor for visible light when it uses an organic pigment to be described later.

Figure 9:
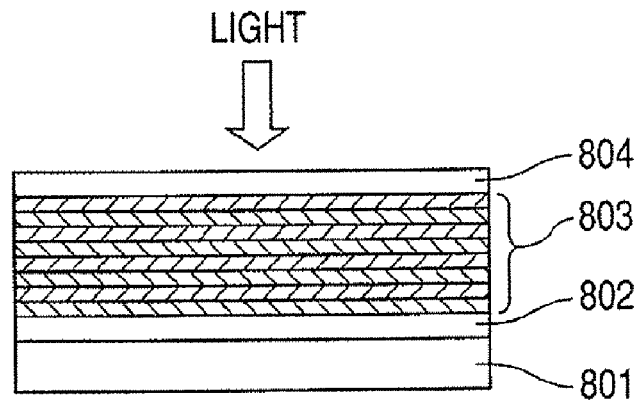
FIG. 9 is a second schematic explanatory view showing a second example of the optical sensor of the present invention.

FIG. 9 shows a second schematic structural view of the sensor in the present invention.

The second sensor of the present invention is constituted of a lower electrode (802), a semiconductor layer (803) having a multilayer structure which is constituted by laminating multiple amorphous oxide semiconductor layers, and an upper electrode (804) on a substrate (801).

It is also preferable to form the semiconductor layer having a multilayer structure by appropriately optimizing the thickness of each semiconductor layer depending on the wavelength of light with which the layer is irradiated. The thickness of each semiconductor layer constituting the semiconductor layer having a multilayer structure is preferably 1 nm to 100 nm, or more preferably 5 nm to 50 nm. The entire thickness of the semiconductor layer having a multilayer structure is preferably 10 nm to 1·m, or more preferably 10 nm to 500 nm.

The semiconductor layer having a multilayer structure is constituted of, for example, amorphous oxide layers composed of mutually different materials, or amorphous oxide layers having mutually different thicknesses.

When light is applied from the upper electrode, a material and a thickness through each of which applied light can transmit needs to be selected for the upper electrode. For example, an oxide transparent conductive film is preferable. When light is applied from the side of the substrate, a quartz material, an acrylic resin, or the like which are excellent in translucency is a preferable material for the substrate. In this case, an oxide transparent conductive film having a wide band gap is preferably used for the lower electrode.

The case where the amorphous oxide semiconductor of the present invention is sensitized with an organic pigment will be described.

As shown in FIG. 8, in the case where light incidence takes place from an upper portion of the optical sensor device, the amorphous oxide semiconductor film is deposited and then immersed in an organic solvent into which an organic pigment is dissolved to cause the organic pigment to adsorb to the semiconductor. Alternatively, the organic pigment is deposited from the vapor onto the semiconductor by means of a vacuum deposition method. After that, the upper electrode is formed by means of a vacuum deposition method or a sputtering method.

In the case where light incidence takes place from the side of the substrate, the organic pigment is caused to adsorb to the lower electrode. After that, the amorphous oxide semiconductor is formed by means of a laser ablation method or a sputtering method.

Furthermore, as shown in FIG. 9, in the case where a semiconductor layer having a multilayer structure is to be sensitized with an organic pigment, the semiconductor layer having a multilayer structure can be formed by repeatedly laminating organic pigments by means of an immersion method, a deposition method, or the like every time each semiconductor layer is laminated.

In that case, it is preferable to make such a distribution as to change from a pigment capable of absorbing light having a short wavelength to a pigment capable of absorbing light having a long wavelength as light enters a deeper portion of the semiconductor layer from its incidence side.

The substrate to be used in the present invention may be conductive or electrically insulating properties. Examples of a conductive substrate include metals and alloys of the metals such as NiCr, stainless steel, Al, Cr, Mo, Au, Nb, Ta, V, Ti, Pt, and Pb. Examples of an electrically insulating substrate include films made of synthetic resins such as an acrylic resin, polyester, polyethylene, polycarbonate, cellulose acetate, polypropylene, polyvinyl chloride, polyvinylidene chloride, polystyrene, and polyamide; sheets; glass; ceramics; and paper. At least one surface of each of those electrically insulating substrates is preferably subjected to a conductive treatment, and a light-receiving layer is desirably arranged on the surface subjected to the conductive treatment.

For example, a thin film composed of NiCr, Al, Cr, Mo, Au, Ir, Nb, Ta, V, Ti, Pt, Pd, $InO_3$, ITO ($In_2O_3$+Sn) or the like is arranged on the surface of glass to impart conductivity. Alternatively, a thin film composed of a metal such as NiCr, Al, Ag, Pb, Zn, Ni, Au, Cr, Mo, Ir, Nb, Ta, V, Tl, or Pt is arranged on the surface of a synthetic resin film such as a polyester film by means of vacuum deposition, electron beam deposition, sputtering, or the like, or the surface is subjected to lamination with the metal, to impart conductivity to the surface. The substrate is preferably a substrate having flexibility, that is, the substrate is preferably deformable (especially bendable).

The light transmittance of an oxide transparent conductive film to be used in the present invention is preferably 60% or more, or more preferably 85% or more. In addition, the film desirably has a sheet resistance of 100· or less so as not to serve as an electrical resistance component with respect to the output of a photovoltaic device. The term "light transmittance" mentioned above refers to the transmittance of light in a wavelength range to be detected by an optical sensor. Examples of a material having such properties include extremely thin and transparent metal films formed of metal oxides such as $SnO_2$, $In_2O_3$, ITO ($SnO_2$+$In_2O_3$), ZnO, CdO, $Cd_2SnO_4$, $TiO_2$, and $Ti_3N_4$; and metals such as Au, Al, and Cu.

Of those, a transparent electrode made of an indium oxide or an indium-tin oxide is particularly suitable. Examples of an available method of producing the electrode include a resistance heating deposition method, an electron beam heating deposition method, a sputtering method, and a spray method, and the methods are appropriately selected as desired. Of those, a sputtering method and a vacuum deposition method are optimum deposition methods.

The organic pigment is selected from a cyanine pigment, a merocyanine pigment, a phthalocyanine pigment, a naphthalocyanine pigment, a phthalo/naphthalo-mixed phthalocyanine pigment, a dipyridyl Ru complex pigment, a terpyridyl Ru complex pigment, a phenanthroline Ru complex pigment, a phenylxanthene pigment, a triphenylmethane pigment, a coumarin pigment, an acridine pigment, and an azo metal complex pigment each of which can chemically bond to the semiconductor. Of course, multiple pigments may be used in combination.

An organic pigment sensitizer suitable for the present invention is preferably one capable of forming a bond with the amorphous oxide semiconductor mainly composed of In—Ga—Zn—O of the present invention, the bond facilitating the movement of photo-excited charge.

A pigment that adsorbs to a semiconductor layer to function as a photosensitizer is one showing absorption in various visible light regions and/or an infrared light region.

A pigment preferably has, in a pigment molecule, a carboxylic group, a carboxylic anhydride group, an alkoxy group, a hydroxyalkyl group, a sulfonic group, a hydroxyl group, an ester group, a mercapto group, a phosphonyl group, or the like in order to cause the pigment to strongly adsorb to the semiconductor layer.

Of those, a carboxylic group and a carboxylic anhydride group are particularly preferable. It should be noted that each of the groups provides an electrical bond that facilitates the movement of an electron between a pigment in an excited state and the conduction band of the amorphous oxide semiconductor.

Examples of pigments having the groups include a ruthenium bipyridine-based pigment, an azo-based pigment, a quinone-based pigment, a quinoneimine-based pigment, a quinacridone-based pigment, a triphenylmethane-based pigment, and a xanthene-based pigment. The examples further include a squarilium-based pigment, a cyanine-based pigment, a merocyanine-based pigment, a porphyrin-based pigment, a phthalocyanine-based pigment, a perylene-based pigment, an indigo-based pigment, and a naphthalocyanine-based pigment.

Examples of a method of causing the pigment to adsorb to the semiconductor layer include a method involving immersing a semiconductor layer formed on a conductive substrate into a solution into which a pigment is dissolved (a solution for pigment adsorption); and a method involving depositing an organic pigment from the vapor. The examples further include a method involving heating an organic pigment, transporting the organic pigment by means of an inert gas such as helium or nitrogen, and causing the organic pigment to adsorb to a semiconductor. It is preferable to form an organic pigment on an amorphous oxide semiconductor in a monomolecular layer fashion.

Any solvent can be used as long as it is capable of dissolving a pigment, and specific examples of such solvent include alcohols such as ethanol; ketones such as acetone; ethers such as diethyl ether and tetrahydrofuran; and nitrogen compounds such as acetonitrile. The examples further include halogenated aliphatic hydrocarbons such as chloroform; aliphatic hydrocarbons such as hexane; aromatic hydrocarbons such as benzene; esters such as ethyl acetate; and water. Two or more kinds of those solvents may be used as a mixture.

The pigment concentration in a solution, which can be appropriately adjusted depending on the pigment to be used and a kind of solvent, is preferably as high as possible in order to enhance adsorption function. For example, the pigment concentration is preferably $1 \times 10^{-5}$ mol/l or more, or more preferably $1 \times 10^{-4}$ mol/l or more.

In the present invention, an organic pigment corresponding to a wavelength range as a target for an optical sensor device is preferably selected and used in an appropriate manner. A single pigment may be used for the pigment, or multiple pigments may be used in combination for the pigment.

Second Embodiment

Figure 10:
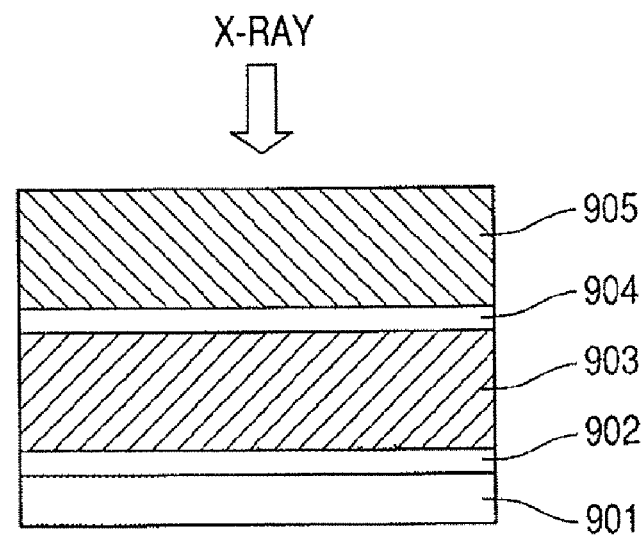
FIG. 10 is a schematic structural view of an X-ray sensor of the present invention.

FIG. 10 shows a schematic view of an image pickup device according to the present invention. The invention according to this embodiment is, for example, an X-ray image sensor. The image pickup device of the present invention is constituted of a lower electrode 902, a semiconductor layer 903 to serve as an opto-electric conversion element, an upper electrode 904, and a scintillator 905 on a deformable substrate 901. The constitution shown in FIG. 8 or 9 can be used for the constitution from the substrate 901 to the upper electrode 904. The semiconductor layer is formed of, for example, an amorphous oxide containing at least In—Ga—Zn—O.

At least part of the image pickup device according to the present invention preferably has a non-flat portion. Of course, an image pickup device which instantaneously has a flat shape but can be deformed into a non-flat shape is also preferable.

An amorphous oxide (to be described in detail later) may be used for the semiconductor layer 903, or amorphous silicon or the like may be used for the layer. As described later, an oxide having an electron carrier concentration of less than $10^{18}/cm^3$ or an oxide whose electron mobility tends to increase with increasing electron carrier concentration can be used for the amorphous oxide.

In addition to a glass substrate or the like, a resin, plastic, or polyethylene terephthalate (PET) is applicable to the substrate. The substrate is preferably a flexible substrate.

In the X-ray sensor, the scintillator 905 mainly using a phosphor is used as required, and may be omitted when the above-described semiconductor layer is sensitive to X-ray.

NaI (Tl) (deliquescent), CsI (Tl) (deliquescent), Cs (Na) (deliquescent), CsI (pure), $CaF_2$ (Eu), $BaF_2$, $CdWO_4$, or the like is used for the scintillator. The thickness of the scintillator layer is preferably in the range of 100·m to 500·m because the thickness in the range allows the layer to sufficiently absorb X-ray. The scintillator layer is preferably formed by means of a sputtering method. Before a deliquescent scintillator is used, the scintillator needs to be subjected to a dampproofing treatment. A preferable dampproofing treatment involves laminating a dampproofing layer (such as a silicon nitride layer or a silicon oxide layer) having a thickness of 100 nm or more on each of the rear surface of the substrate 901 and the surface of the scintillator.

Figure 11:
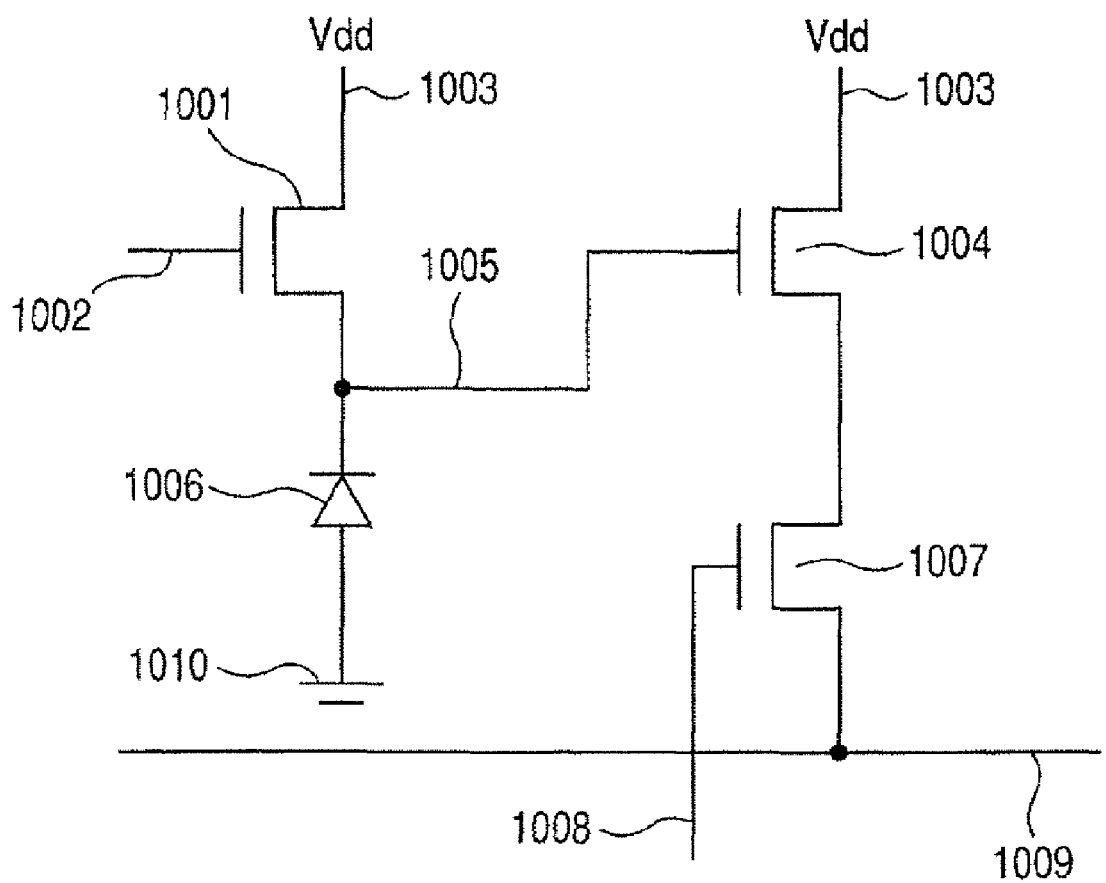
FIG. 11 is a pixel circuit diagram of a non-flat imager of the present invention.

FIG. 11 shows a circuit per one pixel using a TFT using an amorphous oxide such as In—Ga—Zn—O according to the present invention for an active layer; and an X-ray sensor composed of a scintillator and an opto-electric conversion element using an oxide semiconductor containing In—Ga—Zn—O.

The TFT is preferably of a normally-off TFT in which the amorphous oxides as described later are used for an active layer of the TFT.

The sensing operation of an imaging sensor having such a three-transistor pixel structure is as follows.

In an X-ray sensor 1006, an X-ray enters a scintillator to be converted into visible light. The light is converted into electricity by an In—Ga—Zn—O-containing oxide semiconductor sensitized with a pigment. The converted signal charge changes the potential of a floating node 1005 as a source end of a reset TFT 1001. As a result, the gate potential of a select TFT 1004 as a driver for a pixel level source follower is changed. The bias of the source end of the select TFT 1004 or of the drain node of an access TFT 1007 is changed.

While signal charge is accumulated in this way, the potentials of the source end of the reset TFT 1001 and the source end of the select TFT 1004 change. At this time, if a low selection signal is inputted to the gate of the access TFT 1007 via a low selection signal input terminal 1008, a potential difference due to the signal charge generated by the X-ray sensor 1006 will be outputted toward a column selection line 1009.

In this way, a signal level due to the generation of charge by the X-ray sensor 1006 is detected. After that, a reset signal via a reset signal input terminal 1002 changes a reset transistor 1 into an on state. Thus, the signal charge accumulated in the X-ray sensor 1006 is entirely reset.

When a semiconductor layer which is sensitive to X-ray is used, of course, the scintillator can be omitted. In addition, the organic pigment can be omitted. The active layer of the above TFT can be formed of, for example, an amorphous oxide to be described later. For example, an oxide having an electron carrier concentration of less than $10^{18}/cm^3$ or an oxide whose electron mobility tends to increase with increasing electron carrier concentration can be used for the amorphous oxide.

The above TFT can be arranged on one side of the optoelectric conversion element with the aid of the upper electrode 904, the semiconductor layer 903, and the lower electrode 902. A layer for the above TFT may be separately arranged between the substrate 901 and the lower electrode 902.

The thickness of the oxide semiconductor layer in respect of X-ray absorption is 50·m or larger, preferably 100·m or larger, and more preferably 300·m or larger.

Both the semiconductor of the X-ray sensor and the active layer of the TFT for receiving (or reading) a signal from the sensor can be comprised of an amorphous oxide, which is a preferable constitution in the case where higher flatness is required.

Figure 12:
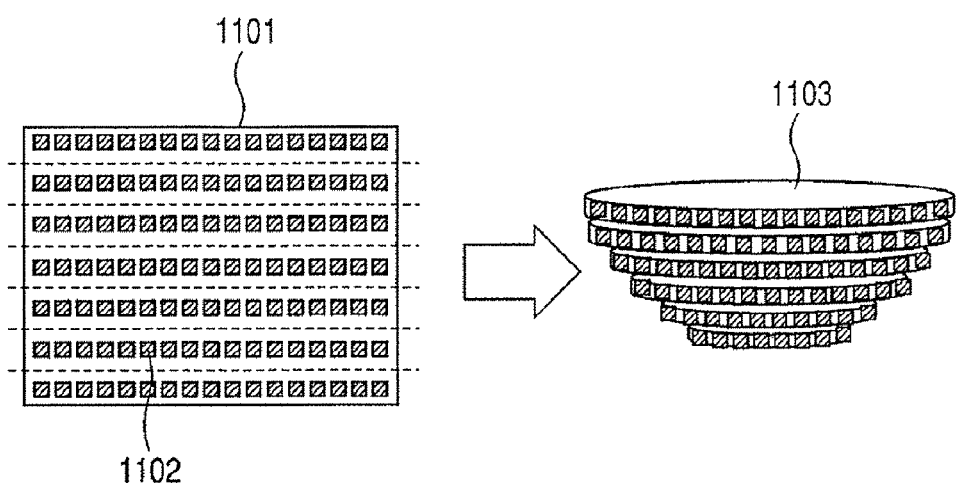
FIG. 12 is a schematic explanatory view for explaining a method of producing the non-flat imager of the present invention.

Multiple imaging sensor units shown in FIG. 11 each formed on a deformable substrate were arranged to constitute a non-flat imager. The resolution of the imager was set to be equal to or larger than XGA (1,024×768), SXGA (1,280×1,024), or the like. FIG. 12 shows an example of a method of producing the non-flat imager. As shown on the left side of FIG. 12, sensor units produced on a flat surface are cut at broken lines to constitute a spherical shape as shown on the right side of the figure. Thus, a semispherical non-flat imager is constituted. Reference numeral 1101 denotes a TFT and a sensor formed on a flat surface. Reference numeral 1102 denotes a TFT and a sensor unit. Reference numeral 1103 denotes a semispherical non-flat imager provided with the TFT and the sensor described above.

The arrangement of a TFT and a sensor portion on the non-flat surface of the non-flat imager can be realized as follows. For example, at first, a TFT and the like are arranged on a flexible substrate made of plastic, PET, or the like, that is, on a flat surface. After that, the flexible substrate is pressed against a non-flat mold while the substrate is heated, to thereby deform the flat substrate into a non-flat substrate. Of course, the term "non-flat imager" as used herein comprehends both an imager having a flat region and a non-flat region and an imager that can be deformed from a flat state to a non-flat state.

Figure 13:
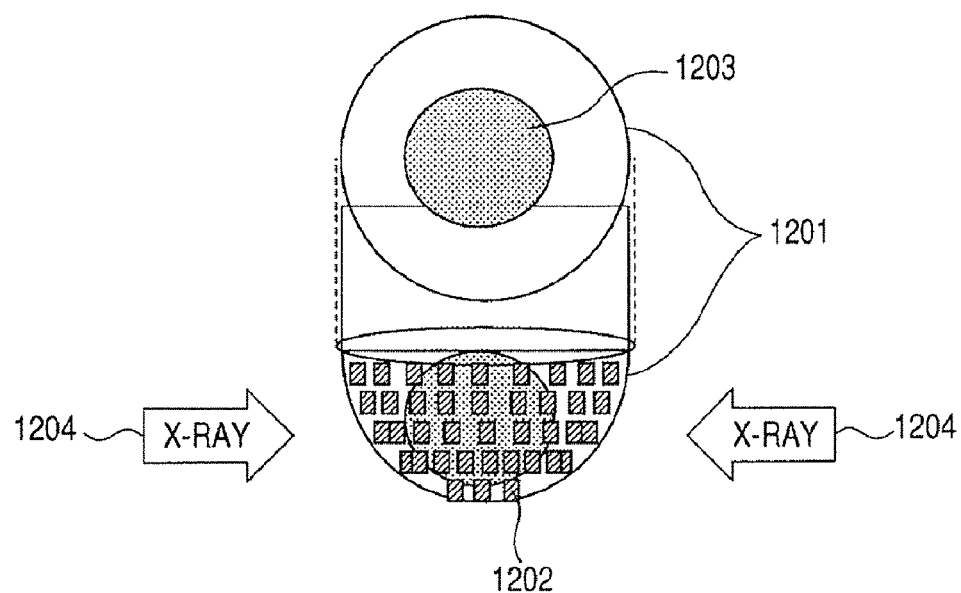
FIG. 13 is a schematic explanatory view of X-ray measurement by means of the non-flat imager of the present invention.

FIG. 13 shows an example of a measurement method by means of the non-flat imager of the present invention. A measuring object 1203 is fed into a non-flat imager 1201 formed in FIG. 12, and the resultant is irradiated with an external X-ray 1204 to subject the measuring object 1203 to measurement. It is also preferable to form a sensor unit in one half of the semispherical non-flat imager in such a manner that no sensor unit enters a gap between an X-ray source and the measuring object.

(Amorphous Oxide Semiconductor)

As described above, in the present invention, an amorphous oxide semiconductor having a desired electron carrier concentration is used as an optical sensor portion itself or as an active layer of a field effect transistor to be used for an optical sensor. Of course, the amorphous oxide semiconductor may be used as each of them.

The electron carrier concentration of the amorphous oxide semiconductor according to the present invention is a value measured at room temperature. Room temperature is, for example, 25° C., and, specifically, is a temperature appropriately selected from the range of about 0° C. to 40° C. It should be noted that there is no need for the electron carrier concentration of the amorphous oxide semiconductor according to the present invention to have a value of less than $10^{18}/cm^3$ in the entire range of 0° C. to 40° C. For example, an electron carrier concentration of less than $10^{18}/cm^3$ has only to be realized at 25° C. In addition, reducing the electron carrier concentration to $10^{17}/cm^3$ or less, or more preferably $10^{16}/cm^3$ or less provides a normally-off TFT with high yield.

The electron carrier concentration can be measured through Hall effect measurement.

The term "amorphous oxide" as used herein refers to an oxide having a halo pattern to be observed, and showing no specific diffraction ray, in an X-ray diffraction spectrum.

The lower limit for the electron carrier concentration in the amorphous oxide semiconductor of the present invention is not particularly limited as long as the amorphous oxide semiconductor is applicable to a channel layer of a TFT. The lower limit is, for example, $10^{12}/cm^3$.

Therefore, in the present invention, as in each of the examples to be described later, the electron carrier concentration is set to fall within the range of, for example, preferably $10^{12}/cm^3$ (inclusive) to $10^{18}/cm^3$ (exclusive), more preferably $10^{13}/cm^3$ to $10^{17}/cm^3$ (both inclusive), or still more preferably $10^{15}/cm^3$ to $10^{16}/cm^3$ (both inclusive) by controlling the material, composition ratio, production conditions, and the like of the amorphous oxide.

In addition to an InZnGa oxide, the amorphous oxide can be appropriately selected from an In oxide, an $In_xZn_{1-x}$ oxide (0.2·x·1), an $In_xSn_{1-x}$ oxide (0.8·x·1), and an $In_x(Zn, Sn)_{1-x}$ oxide (0.15·x·1).

The $In_x(Zn, Sn)_{1-x}$ oxide can be described as an $In_x(Zn_y, Sn_{1-y})_{1-x}$ oxide, and y ranges from 1 to 0.

Part of In in an In oxide containing none of Zn and Sn can be replaced with Ga. That is, the In oxide can be turned into an $In_xGa_{1-x}$ oxide (0·x·1).

Hereinafter, an amorphous oxide having an electron carrier concentration of less than $10^{18}/cm^3$ that the inventors of the present invention have succeeded in producing will be described in detail.

The oxide contains In—Ga—Zn—O, its composition in a crystalline state is represented by $InGaO_3(ZnO)_m$ (where m represents a natural number of less than 6), and its electron carrier concentration is less than $10^{18}/cm^3$.

The oxide contains In—Ga—Zn—Mg—O, its composition in a crystalline state is represented by $InGaO_3(Zn_{1-x}Mg_xO)_m$ (where m represents a natural number of less than 6 and 0<x·1), and its electron carrier concentration is less than $10^{18}/cm^3$.

A film constituted of each of those oxides is preferably designed to have an electron mobility in excess of 1 $cm^2/(V·sec)$.

The use of the film for a channel layer enables transistor characteristics including a gate current at the time of turning a transistor off of less than 0.1·A (that is, normally off) and an on-off ratio in excess of $10^3$. In addition, the use realizes a flexible TFT, which is transparent, or has transmissivity, with respect to visible light.

The electron mobility of the film increases with increasing number of conduction electrons. A glass substrate, a plastic substrate made of a resin, a plastic film, or the like can be used as a substrate for forming a transparent film.

When the amorphous oxide semiconductor film is used for a channel layer, one of $Al_2O_3$, $Y_2O_3$, and $HfO_2$, or a mixed crystal compound containing at least two kinds of these compounds can be used for a gate insulation film.

It is also preferable to form the amorphous oxide into a film in an atmosphere containing an oxygen gas without intentionally adding any impurity ion for increasing an electrical resistance of the oxide.

The inventors of the present invention have found that the semi-insulating oxide amorphous thin film has specific property with which the electron mobility of the film increases with increasing number of conduction electrons. Furthermore, the inventors have found that a TFT produced by means of the film is provided with additionally improved transistor characteristics including on-off ratio, saturation current in a pinch-off state, and switching speed. That is, the inventors have found that a normally-off TFT can be realized by using an amorphous oxide.

The use of the amorphous oxide thin film for a channel layer of a film transistor provides an electron mobility in excess of 1 cm$^2$/(V·sec), preferably in excess of 5 cm$^2$/(V·sec).

When the electron carrier concentration is less than $10^{18}$/cm$^3$, or preferably less than $10^{16}$/cm$^3$, a current between drain and source terminals at the time of off (when no gate voltage is applied) can be set to be less than 10·A, or preferably less than 0.1·A.

The use of the film provides saturation current after pinch-off in excess of 10·A and an on-off ratio in excess of $10^3$ when the electron mobility exceeds 1 cm$^2$/(V·sec), or preferably exceeds 5 cm$^2$/(V·sec).

In a TFT, a high voltage is applied to a gate terminal in a pinch-off state, and electrons are present in a channel at a high density.

Therefore, according to the present invention, saturation current value can be increased by an amount corresponding to an increase in electron mobility. As a result, improvements of transistor characteristics including an increase in on-off ratio, an increase in saturation current, and an increase in switching speed can be expected.

In a typical compound, when the number of electrons increases, electron mobility reduces owing to a collision between electrons.

Examples of a structure that can be used for the TFT include a stagger (top gate) structure in which a gate insulation film and a gate terminal are formed in order on a semiconductor channel layer; and an inversely staggered (bottom gate) structure in which a gate insulation film and a semiconductor channel layer are formed in order on a gate terminal.

(First Film Forming Method: PLD Method)

The amorphous state of an amorphous oxide thin film whose composition in a crystalline state is represented by InGaO$_3$(ZnO)$_m$ (where m represents a natural number of less than 6) is stably maintained up to a high temperature equal to or higher than 800° C. when the value of m is less than 6. However, as the value of m increases, that is, as the ratio of ZnO to InGaO$_3$ increases to cause the composition to be close to a ZnO composition, the thin film is apt to crystallize.

Therefore, a value of m of less than 6 is preferable for a channel layer of an amorphous TFT.

A vapor phase deposition method involving the use of a polycrystalline sintered material having an InGaO$_3$(ZnO)$_m$ composition as a target is a desirable film forming method. Of such vapor phase deposition methods, a sputtering method and a pulse laser deposition method are suitable. Furthermore, a sputtering method is most suitable from the viewpoint of mass productivity.

However, when the amorphous film is produced under typical conditions, an oxygen defect mainly occurs, so it has been unable to provide an electron carrier concentration of less than $10^{18}$/cm$^3$, that is, an electric conductivity of 10 S/cm or less. The use of such film makes it impossible to constitute a normally-off transistor.

Figure 14:
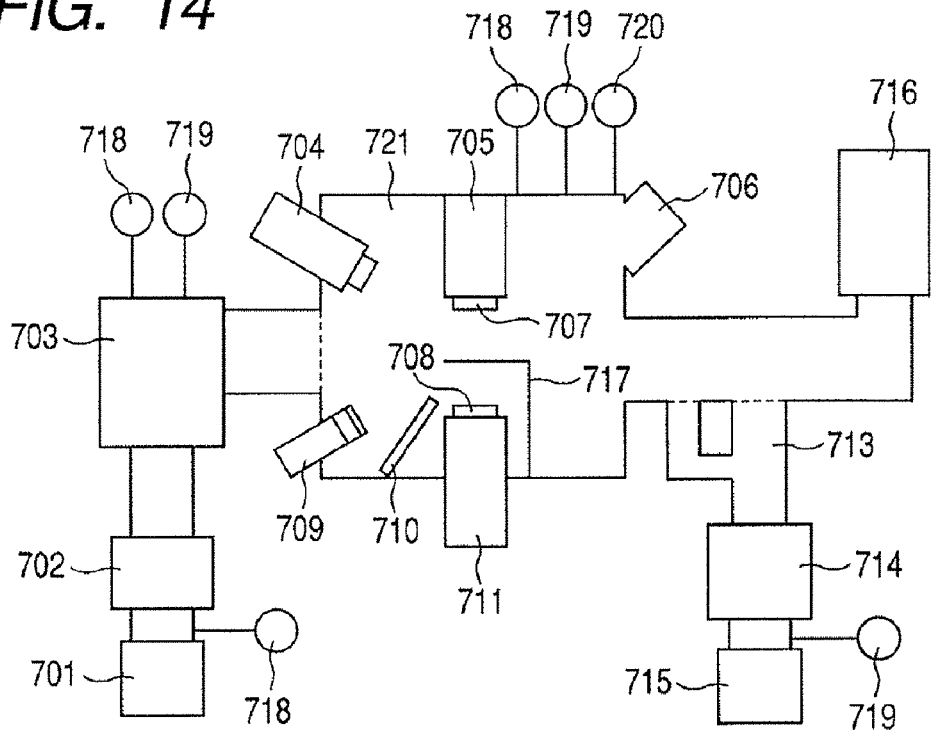
FIG. 14 is a schematic view showing a pulse laser deposition apparatus.

The inventors of the present invention have produced In—Ga—Zn—O by means of a pulse laser deposition method with the aid of an apparatus shown in FIG. 14.

Film formation was performed by means of such PLD film forming apparatus as shown in FIG. 14.

In the figure, reference numeral 701 denotes a rotary pump (RP); 702, a turbo-molecular pump (TMP); 703, a preparatory chamber; 704, an electron gun for RHEED; 705, substrate holding means for rotating, and moving vertically, a substrate; 706, a laser entrance window; 707, the substrate; 708, a target; 709, a radical source; 710, a gas inlet; 711, target holding means for rotating, and moving vertically, the target; 712, a bypass line; 713, a main line; 714, a turbo-molecular pump (TMP); 715, a rotary pump (RP); 716, a titanium getter pump; and 717, a shutter. In addition, in the figure, reference numeral 718 denotes an ion vacuum gauge (IG); 719, a Pirani vacuum gauge (PG); 720, a baratron vacuum gauge (BG); and 721, a growth chamber (chamber).

An In—Ga—Zn—O-based amorphous oxide semiconductor thin film was deposited on an SiO$_2$ glass substrate (1737 manufactured by Corning Inc.) by means of a pulse laser deposition method using a KrF excimer laser. Prior to the deposition, the substrate was subjected to degreasing washing by means of an ultrasonic wave for 5 minutes in each of acetone, ethanol, and ultrapure water, and then was dried in the air at 100° C. An InGaO$_3$(ZnO)$_4$ sintered material target (having a diameter of 20 mm and a thickness of 5 mm) was used as the polycrystalline target. The target was produced by wet-mixing 4N reagents of In$_2$O$_3$, Ga$_2$O$_3$, and ZnO as starting materials in ethanol as a solvent; calcining the mixture at 1,000° C. for 2 hours; dry-pulverizing the resultant; and sintering the pulverized product at 1,550° C. for 2 hours. The target thus produced had an electric conductivity of 90 (S/cm).

Film formation was performed with the ultimate pressure in the growth chamber set to $2\times10^{-6}$ (Pa) and the oxygen partial pressure during growth controlled to be 6.5 (Pa).

The oxygen partial pressure in the chamber 721 was 6.5 Pa and the substrate temperature was 25° C.

The distance between the target 708 and the deposition substrate 707 was 30 (mm), and the power of the KrF excimer laser incident from the entrance window 706 was in the range of 1.5 to 3 (mJ/cm$^2$/pulse). The pulse width, pulse rate, and irradiation spot diameter were set to 20 (nsec), 10 (Hz), and 1×1 (mm square), respectively.

Thus, film formation was performed at a film-forming rate of 7 (nm/min).

X-ray diffraction was conducted on the resultant thin film by means of an X-ray at an angle of incidence as close as the thin film (thin film method, angle of incidence 0.5 degree). As a result, no clear diffraction peak was observed. Therefore, the produced In—Ga—Zn—O-based thin film can be said to be amorphous.

Furthermore, X-ray reflectance measurement was performed, and pattern analysis was performed. As a result, the thin film was found to have a mean square roughness (Rrms) of about 0.5 nm and a thickness of about 120 nm. X-ray fluorescence (XRF) analysis confirmed that the metal composition ratio of the thin film was In:Ga:Zn=0.98:1.02:4.

The film had an electric conductivity of less than about $10^{-2}$ S/cm. The electron carrier concentration and electron mobility of the film are estimated to be about $10^{16}$/cm$^3$ or less and about 5 cm$^2$/(V·sec), respectively.

Owing to the analysis of a light absorption spectrum, the forbidden band energy width of the produced amorphous thin film was determined to be about 3 eV. The foregoing shows that the produced In—Ga—Zn—O-based thin film is a transparent and flat thin film showing an amorphous phase close to the composition of InGaO$_3$(ZnO)$_4$ as a crystal, having little oxygen defect, and having a small electric conductivity.

Figure 1:
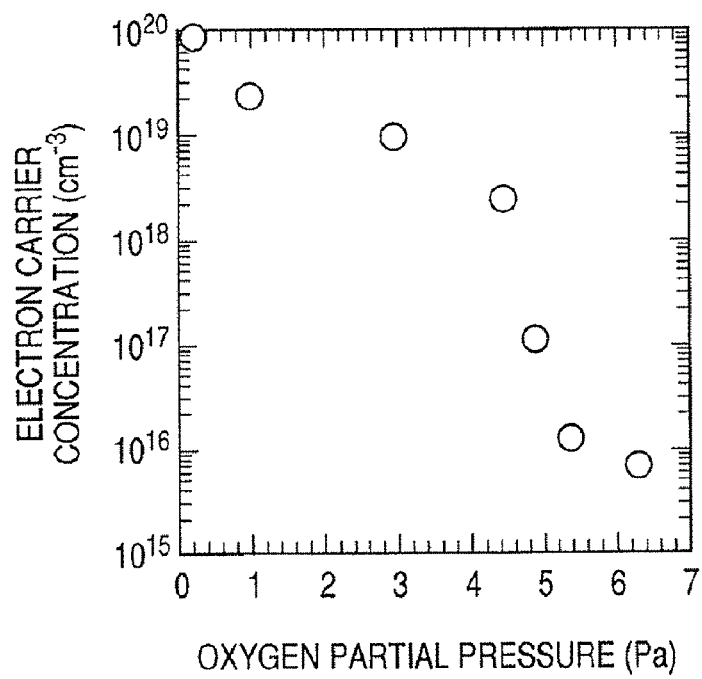
FIG. 1 is a graph showing a relationship between the electron carrier concentration of an In—Ga—Zn—O-based amorphous oxide semiconductor formed by means of a pulse laser deposition method and an oxygen partial pressure during film formation.

Specific description will be made with reference to FIG. 1. The figure shows change of the electron carrier concentration of a transparent amorphous oxide thin film formed with changing oxygen partial pressure under the same conditions as those of this embodiment, which film is composed of In—Ga—Zn—O and has a composition in an assumed crystalline state represented by $InGaO_3(ZnO)_m$ (where m represents a number of less than 6).

Film formation was performed in an atmosphere having a high oxygen partial pressure in excess of 4.5 Pa under the same conditions as those of this embodiment. As a result, as shown in FIG. 1, it was able to reduce the electron carrier concentration to less than $10^{18}/cm^3$. In this case, the substrate had a temperature maintained at a temperature nearly equal to room temperature unless intentionally heated. The substrate temperature is preferably kept at a temperature lower than 100° C. in order to use a flexible plastic film as a substrate.

Additionally increasing the oxygen partial pressure can additionally reduce the electron carrier concentration. For example, as shown in FIG. 1, an $InGaO_3(ZnO)_4$ thin film formed at a substrate temperature of 25° C. and an oxygen partial pressure of 5 Pa had a number of electron carriers reduced to $10^{16}/cm^3$.

Figure 2:
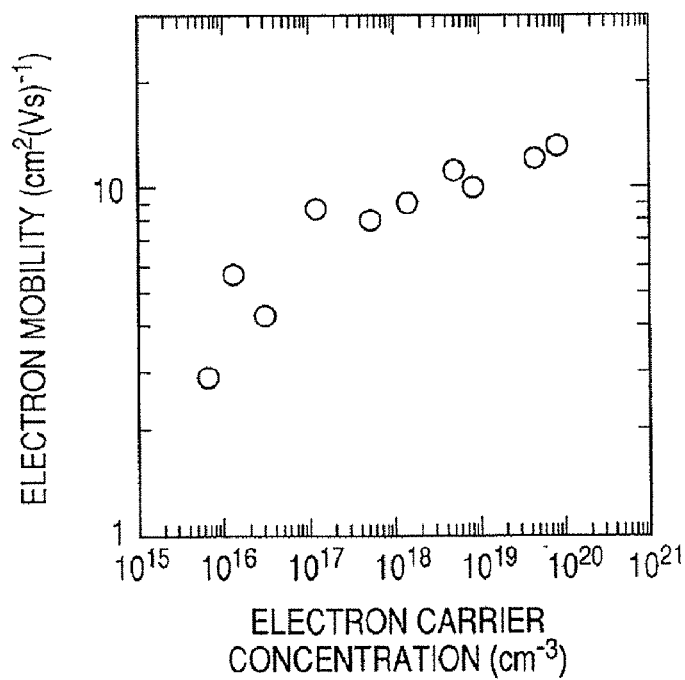
FIG. 2 is a graph showing a relationship between the electron carrier concentration and electron mobility of an In—Ga—Zn—O-based amorphous oxide semiconductor formed by means of a pulse laser deposition method.

As shown in FIG. 2, the resultant thin film had an electron mobility in excess of 1 $cm^2/(V\cdot sec)$. However, in the pulse laser deposition method of this embodiment, when the oxygen partial pressure is 6.5 Pa or more, the surface of the deposited film becomes irregular, so it becomes difficult to use the film as a channel layer of a TFT.

Therefore, a normally-off transistor can be constituted by using a transparent amorphous oxide thin film having a composition in a crystalline state represented by $InGaO_3(ZnO)_m$ (where m represents a number of less than 6) by means of a pulse laser deposition method in an atmosphere having an oxygen partial pressure in excess of 4.5 Pa, or desirably in excess of 5 Pa and less than 6.5 Pa.

In addition, the thin film had an electron mobility in excess of 1 $cm^2/V\cdot sec$, so the on-off ratio was able to exceed $10^3$.

As described above, when an InGaZn oxide is formed into a film by means of the PLD method under the conditions shown in this embodiment, the oxygen partial pressure is desirably controlled to be 4.5 Pa or more and less than 6.5 Pa.

The realization of an electron carrier concentration of less than $10^{18}/cm^3$ depends on, for example, a condition for an oxygen partial pressure, the structure of a film forming apparatus, and a material and a composition to be formed into a film.

Figure 5:
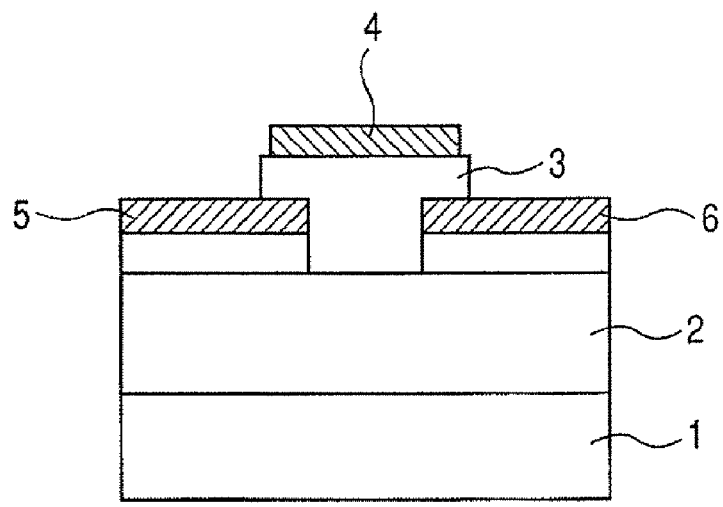
FIG. 5 is a schematic structural view of a TFT produced for evaluating an amorphous oxide semiconductor used for an optical sensor of the present invention.

Next, an amorphous oxide was produced at an oxygen partial pressure of 6.5 Pa in the above apparatus, and then a top gate MISFET device shown in FIG. 5 was produced. To be specific, at first, a semi-insulating amorphous $InGaO_3(ZnO)_4$ film having a thickness of 120 nm to be used as a channel layer 2 was formed on a glass substrate 1 by means of the above-described method of producing an amorphous In—Ga—Zn—O thin film.

Then, $InGaO_3(ZnO)_4$ and a gold film each having a large electric conductivity and a thickness of 30 nm were laminated on the film by means of a pulse laser deposition method with the oxygen partial pressure in the chamber set to be less than 1 Pa, to thereby form a drain terminal 5 and a source terminal 6 by means of a photolithography method and a lift-off method. Finally, a $Y_2O_3$ film to be used as a gate insulation film 3 (thickness: 90 nm, relative dielectric constant: about 15, leak current density: $10^{-3}$ $A/cm^2$ upon application of 0.5 MV/cm) was formed by means of an electron beam deposition method. A gold film was formed on the $Y_2O_3$ film, to thereby form a gate terminal 4 by means of a photolithography method and a lift-off method.

Evaluation of MISFET Device for Characteristics

Figure 6:
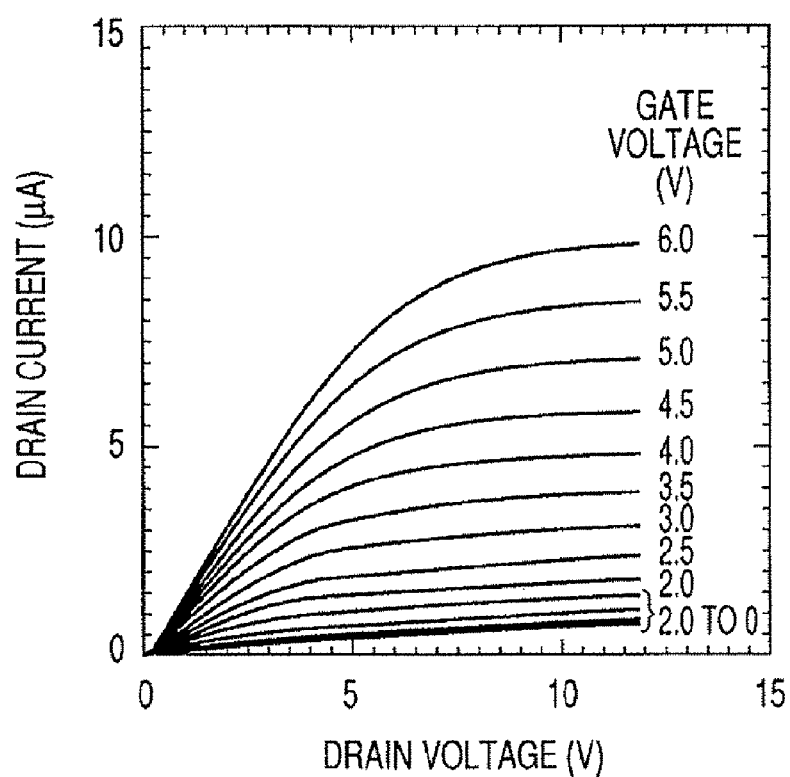
FIG. 6 is a graph showing the current-voltage characteristics of a top gate MISFET device.

FIG. 6 shows the current-voltage characteristics of an MISFET device measured at room temperature. The fact that a drain current $I_{DS}$ increased with increasing drain voltage $V_{DS}$ shows that the channel is an n-type semiconductor. This is not in contradiction to the fact that an amorphous In—Ga—Zn—O-based semiconductor is of an n-type. $I_{DS}$ saturated (pinched off) at $V_{DS}$ of about 6 V. The saturation is a typical behavior of a semiconductor transistor. Investigation into a gain characteristic showed that the threshold value for a gate voltage $V_{GS}$ was about −0.5 V upon application of $V_{DS}$=4 V. A current $I_{DS}$=1.0×$10^{-5}$ A flowed when $V_G$=10 V. This corresponds to the fact that a gate bias enabled a carrier to be induced in an In—Ga—Zn—O-based amorphous semiconductor thin film as an insulator.

The transistor had an on-off ratio in excess of $10^3$. The field effect mobility was calculated from an output characteristic. As a result, a field effect mobility of about 7 $cm^2$ $(Vs)^{-1}$ was obtained in the saturation region. The produced device was irradiated with visible light to perform similar measurement. However, no changes in transistor characteristics were observed.

According to this embodiment, a thin film transistor having a channel layer with a small electron carrier concentration (that is, a high electrical resistance) and a large electron mobility can be realized.

The above-described amorphous oxide had excellent properties. That is, electron mobility increased with increasing electron carrier concentration, and degenerate conduction was exhibited.

In this embodiment, a thin film transistor was formed on a glass substrate. A substrate such as a plastic plate or a film can also be used because film formation itself can be performed at room temperature.

In addition, the amorphous oxide obtained in this embodiment absorbs nearly no visible light and can realize a transparent and flexible TFT.

(Second Film Forming Method: Sputtering Method (SP Method))

Description will be given of film formation by means of a high-frequency SP method using an argon gas as an atmospheric gas.

Figure 15:
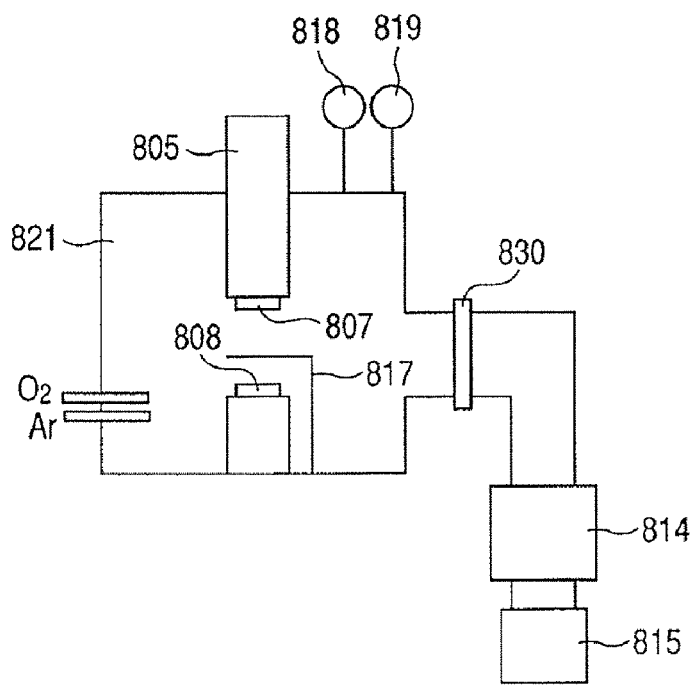
FIG. 15 is a schematic view showing a sputter film forming apparatus.

The SP method was performed by means of an apparatus shown in FIG. 15. In the figure, reference numeral 807 denotes a deposition substrate; 808, a target; 805, substrate holding means equipped with a cooling mechanism; 814, a turbo-molecular pump; 815, a rotary pump; 817, a shutter; 818, an ion vacuum gauge; 819, a Pirani vacuum gauge; 821, a growth chamber (chamber); and 830, a gate valve.

An $SiO_2$ glass substrate (1737 manufactured by Corning Inc.) was prepared as the deposition substrate 807. Prior to film formation, the substrate was subjected to degreasing washing by means of an ultrasonic wave for 5 minutes in each of acetone, ethanol, and ultrapure water, and then was dried in the air at 100° C.

A polycrystalline sintered material having an $InGaO_3(ZnO)_4$ composition (having a diameter of 20 mm and a thickness of 5 mm) was used for the target.

The sintered material was produced by wet-mixing 4N reagents of $In_2O_3$, $Ga_2O_3$, and ZnO as starting materials in ethanol as a solvent; calcining the mixture at 1,000° C. for 2 hours; dry-pulverizing the resultant; and sintering the pulverized product at 1,550° C. for 2 hours. The target 808 had an electric conductivity of 90 (S/cm), and was in a semi-insulating state.

The ultimate pressure in the growth chamber 821 was $1\times10^{-4}$ (Pa) and the total pressure of an oxygen gas and the argon gas during growth was maintained at a constant value in the range of 4 to $0.1\times10^{-1}$ (Pa). Then, the ratio between the partial pressure of the argon gas and the oxygen partial pressure was changed to change the oxygen partial pressure in the range of $10^{-3}$ to $2\times10^{-1}$ (Pa).

In addition, the substrate temperature was set to be room temperature, and the distance between the target 808 and the deposition substrate 807 was 30 (mm).

Supplied power was RF180 W, and film formation was performed at a film forming rate of 10 (nm/min).

X-ray diffraction was conducted on the resultant film by means of an X-ray at an angle of incidence as close as the surface of the film (thin film method, angle of incidence 0.5 degree). As a result, no clear diffraction peak was detected. Therefore, the produced In—Zn—Ga—O-based film was found to be an amorphous film.

Furthermore, X-ray reflectance measurement was performed, and pattern analysis was performed. As a result, the thin film was found to have a mean square roughness (Rrms) of about 0.5 nm and a thickness of about 120 nm. X-ray fluorescence (XRF) analysis confirmed that the metal composition ratio of the thin film was In:Ga:Zn=0.98:1.02:4.

Figure 3:
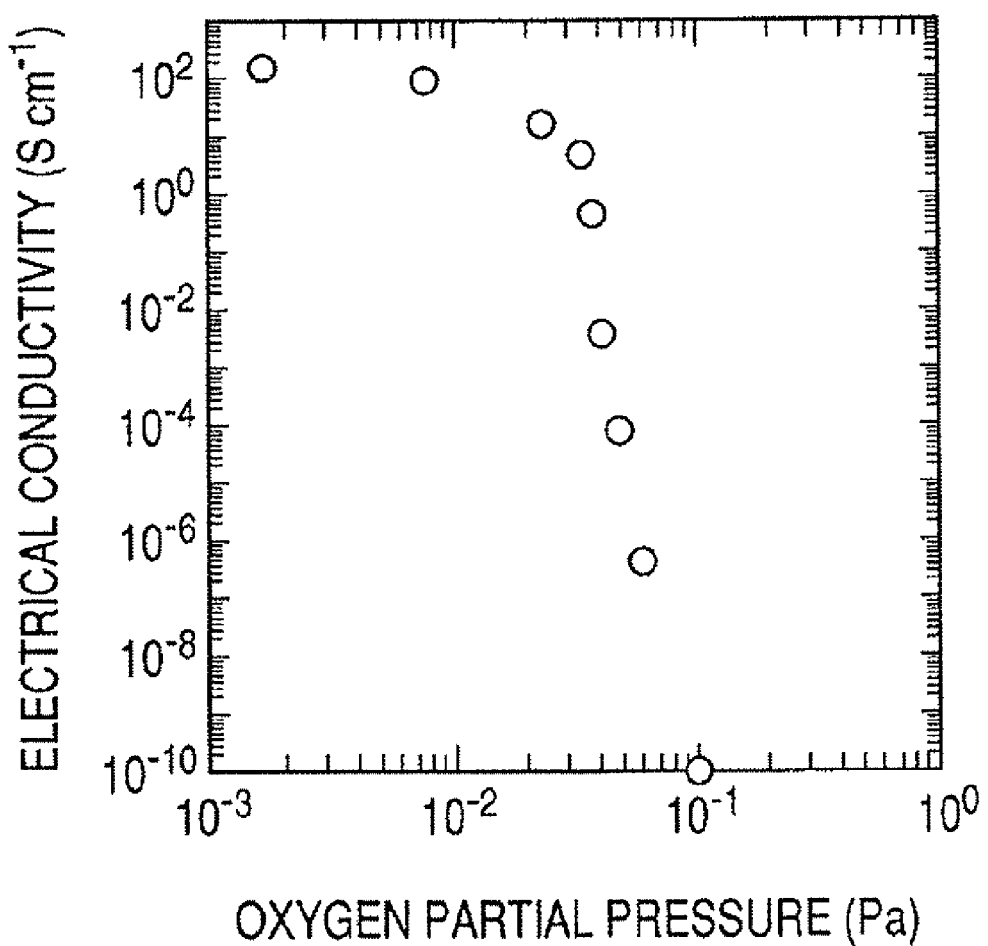
FIG. 3 is a graph showing a relationship between the electric conductivity of an In—Ga—Zn—O-based amorphous oxide semiconductor formed by means of a sputtering method using an argon gas and an oxygen partial pressure during film formation.

The oxygen partial pressure in the atmosphere upon film formation was changed to measure the electric conductivity of the resultant amorphous oxide film. FIG. 3 shows the results.

As shown in FIG. 3, film formation in an atmosphere having a high oxygen partial pressure in excess of $3\times10^{-2}$ Pa was able to reduce an electric conductivity to less than 10 S/cm.

Additionally increasing the oxygen partial pressure was able to reduce the number of electron carriers.

For example, as shown in FIG. 3, an $InGaO_3(ZnO)_4$ thin film formed at a substrate temperature of 25° C. and an oxygen partial pressure of $10^{-1}$ Pa had an electric conductivity additionally reduced to about $10^{-10}$ S/cm. In addition, an $InGaO_3(ZnO)_4$ thin film formed at an oxygen partial pressure in excess of $10^{-1}$ Pa had so high an electrical resistance that its electric conductivity could not be measured. In this case, the electron mobility, which could not be measured, was estimated to be about 1 cm²/V·sec as a result of extrapolation from a value in a film having a large electron carrier concentration.

That is, it was able to constitute a normally-off transistor having an on-off ratio in excess of $10^3$ by using a transparent amorphous oxide thin film which is constituted of In—Ga—Zn—O produced by means of a sputtering deposition method in an argon gas atmosphere having an oxygen partial pressure in excess of $3\times10^{-2}$ Pa, or desirably in excess of $5\times10^{-1}$ Pa, and has a composition in a crystalline state represented by $InGaO_3(ZnO)_m$ (where m represents a natural number of less than 6).

When the apparatus and the material shown in this embodiment are used, the oxygen partial pressure upon film formation by means of sputtering is, for example, in the range of $3\times10^{-2}$ Pa to $5\times10^{-1}$ Pa (both inclusive). As shown in FIG. 2, the electron mobility increases with increasing number of conduction electrons in a thin film produced by means of each of the pulse laser deposition method and the sputtering method.

As described above, controlling an oxygen partial pressure can reduce the number of oxygen defects, thereby reducing an electron carrier concentration. In addition, in an amorphous state, unlike a polycrystalline state, substantially no particle interface is present, so an amorphous thin film having a high electron mobility can be obtained.

It should be noted that an $InGaO_3(ZnO)_4$ amorphous oxide film obtained by using a polyethylene terephthalate (PET) film having a thickness of 200·m instead of a glass substrate also showed similar characteristics.

The use of a polycrystal $InGaO_3(Zn_{1-x}Mg_xO)_m$ (where m represents a natural number of less than 6 and $0<x·1$) as a target provides a high-resistance amorphous $InGaO_3(Zn_{1-x}Mg_xO)_m$ film even at an oxygen partial pressure of less than 1 Pa.

For example, when a target obtained by replacing Zn with 80 at. % of Mg is used, the electron carrier concentration of a film obtained by means of a pulse laser deposition method in an atmosphere having an oxygen partial pressure of 0.8 Pa can be less than $10^{16}/cm^3$ (the electrical resistance is about $10^{-2}$ S/cm).

The electron mobility of such film reduces as compared to a film with no additional Mg, but the degree of the reduction is small: the electron mobility at room temperature is about 5 cm²/(V·sec), which is about one order of magnitude larger than that of amorphous silicon. Upon film formation under the same conditions, the electric conductivity and the electron mobility reduce with increasing Mg content. Therefore, the Mg content is preferably in excess of 20% and less than 85% (that is, $0.2<x<0.85$).

In the thin film transistor using the above-described amorphous oxide film, one of $Al_2O_3$, $Y_2O_3$, and $HfO_2$, or a mixed crystal compound containing at least two kinds of these compounds is preferably used for a gate insulation film.

When a defect is present in an interface between the gate insulation thin film and the channel layer thin film, an electron mobility reduces and hysteresis occurs in transistor characteristics. In addition, leak current varies to a large extent depending on the kind of the gate insulation film. Therefore, a gate insulation film suitable for a channel layer needs to be selected. The use of an $Al_2O_3$ film can reduce leak current. In addition, the use of a $Y_2O_3$ film can reduce hysteresis. Furthermore, the use of an $HfO_2$ film having a high dielectric constant can increase electron mobility. In addition, the use of a mixed crystal of those films can result in the formation of a TFT having a small leak current, small hysteresis, and large electron mobility. In addition, each of a gate insulation film forming process and a channel layer forming process can be performed at room temperature, so each of a staggered structure and an inversely staggered structure can be formed as a TFT structure.

The TFT thus formed is a three-terminal device equipped with a gate terminal, a source terminal, and a drain terminal, and is an active device which uses a semiconductor thin film formed on an insulating substrate such as a ceramic, glass, or plastic as a channel layer in which an electron or a hole moves, and provides a switching function for a current between the source terminal and the drain terminal by applying a voltage to the gate terminal to control a current flowing in the channel layer.

The fact that a desired electron carrier concentration can be achieved by controlling an oxygen defective amount is important in the present invention.

In the foregoing description, the amount of oxygen in an amorphous oxide film (oxygen defective amount) is controlled in an atmosphere containing a predetermined concentration of oxygen upon film formation. It is also preferable to control (reduce or increase) the oxygen defective amount by subjecting the oxide film to a post treatment in an atmosphere containing oxygen after the film formation.

To effectively control the oxygen defective amount, the temperature in the atmosphere containing oxygen is in the range of desirably 0° C. to 300° C. (both inclusive), preferably 25° C. to 250° C. (both inclusive), or more preferably 100° C. to 200° C. (both inclusive).

Of course, the oxygen defective amount may be controlled in the atmosphere containing oxygen upon film formation and then controlled through a post treatment in the atmosphere containing oxygen after the film formation. In addition, the oxygen partial pressure may be controlled not upon film formation but after the film formation through a post treatment in the atmosphere containing oxygen as long as a desired electron carrier concentration (less than $10^{18}/cm^3$) can be obtained.

The lower limit for the electron carrier concentration in the present invention, which varies depending on what kind of device, circuit, or apparatus an oxide film to be obtained is used for, is, for example, $10^{14}/cm^3$ or more.

(Expansion of Material System)

As a result of research on an expanded composition system, it has been found that an amorphous oxide film having a small electron carrier concentration and a large electron mobility can be produced by means of an amorphous oxide composed of an oxide of at least one element of Zn, In, and Sn.

It has also been found that the amorphous oxide film has a specific property with which the electron mobility increases with increasing number of conduction electrons.

A normally-off TFT excellent in transistor characteristics including on-off ratio, saturation current in a pinch-off state, and switching speed can be produced by means of the film.

A composite oxide containing at least one element of the following elements can be constituted by using the above-described amorphous oxide containing at least one element of Zn, In, and Sn.

The elements are a Group II element M2 having an atomic number smaller than that of Zn (M2 represents Mg or Ca); a Group III element M3 having an atomic number smaller than that of In (M3 represents B, Al, Ga, or Y); a Group IV element M4 having an atomic number smaller than that of Sn (M4 represents Si, Ge, or Zr); a Group V element M5 (M5 represents V, Nb, or Ta); Lu; and W.

An oxide having any one of the following characteristics (a) to (h) can be used in the present invention.

(a) An amorphous oxide having an electron carrier concentration of less than $10^{18}/cm^3$ at room temperature.

(b) An amorphous oxide whose electron mobility increases with increasing electron carrier concentration.

The term "room temperature" as used herein refers to a temperature of about 0° C. to 40° C. The term "amorphous" as used herein refers to a compound having only a halo pattern to be observed, and showing no specific diffraction ray, in an X-ray diffraction spectrum. The term "electron mobility" as used herein refers to an electron mobility measured through Hall effect measurement.

(c) An amorphous oxide according to the above item (a) or (b) having electron mobility in excess of 0.1 $cm^2/V \cdot sec$ at room temperature.

(d) An amorphous oxide according to the above item (b) or (c) exhibiting degenerate conduction. The term "degenerate conduction" as used herein refers to a state where heat activation energy in the temperature dependence of an electrical resistance is 30 meV or less.

(e) An amorphous oxide according any one of the above items (a) to (d) containing at least one element of Zn, In, and Sn as a constituent.

(f) An amorphous oxide film obtained by incorporating, into the amorphous oxide according to the above item (e), at least one element of a Group II element M2 having an atomic number smaller than that of Zn (M2 represents Mg or Ca); a Group III element M3 having an atomic number smaller than that of In (M3 represents B, Al, Ga, or Y); a Group IV element M4 having an atomic number smaller than that of Sn (M4 represents Si, Ge, or Zr); a Group V element M5 (M5 represents V, Nb, or Ta); Lu; and W.

(g) An amorphous oxide film according to any one of the above items (a) to (f), which is a single compound having a composition in a crystalline state represented by $In_{1-x}M3_xO_3(Zn_{1-y}M2_yO)_m$ (where $0 \cdot x, y \cdot 1$ and m represents 0 or a natural number of less than 6) or a mixture of compounds having different m's. M3 represents Ga or the like, and M2 represents Mg or the like.

(h) An amorphous oxide film according to any one of the above items (a) to (g) which is arranged on a glass substrate, a metal substrate, a plastic substrate, or a plastic film.

The present invention relates to a field effect transistor using the amorphous oxide or amorphous oxide film described above for a channel layer.

An amorphous oxide film having an electron carrier concentration in excess of $10^{15}/cm^3$ and less than $10^{18}/cm^3$ is used for a channel layer to constitute a field effect transistor in which a source terminal, a drain terminal, and a gate terminal are arranged via a gate insulation film. When a voltage of about 5 V is applied between the source and drain terminals, the current between the source and drain terminals with no gate voltage applied can be about $10^{-7}$ A.

The electron mobility of an oxide crystal increases as the degree to which the s orbitals of metal ions overlap with each other increases. The oxide crystal of Zn, In, or Sn having a large atomic number has a large electron mobility of 0.1 to 200 $cm^2/(V \cdot sec)$.

Furthermore, in the oxide, oxygen and a metal ion bond to each other through an ionic bond.

As a result, even in an amorphous state in which a chemical bond has no directivity, a structure is random, and the direction of bonding is non-uniform, the electron mobility can be comparable to the electron mobility in a crystalline state.

On the other hand, replacing Zn, In, or Sn with an element having a small atomic number reduces the electron mobility. As a result, the electron mobility of the amorphous oxide according to the present invention is about 0.01 $cm^2/(V \cdot sec)$ to 20 $cm^2/(V \cdot sec)$.

When a channel layer of a transistor is produced by means of the above-described oxide, one of $Al_2O_3$, $Y_2O_3$, and $HfO_2$, or a mixed crystal compound containing at least two kinds of these compounds is preferably used for a gate insulation film in the transistor.

When a defect is present in an interface between the gate insulation thin film and the channel layer thin film, electron mobility reduces and hysteresis occurs in transistor characteristics. In addition, leak current varies to a large extent depending on the kind of the gate insulation film. Therefore, a gate insulation film suitable for a channel layer needs to be selected. The use of an $Al_2O_3$ film can reduce leak current. In addition, the use of an $Y_2O_3$ film can reduce hysteresis. Furthermore, the use of an $HfO_2$ film having a high dielectric constant can increase field effect mobility. In addition, the use of a film composed of a mixed crystal of those compounds can result in the formation of a TFT having small leak current, small hysteresis, and large field effect mobility. In addition, each of a gate insulation film forming process and a channel layer forming process can be performed at room temperature, so each of a staggered structure and an inversely staggered structure can be formed as a TFT structure.

An $In_2O_3$ oxide film can be formed by means of a vapor phase method, and an amorphous film can be obtained by adding about 0.1 Pa of water to an atmosphere during film formation.

Although an amorphous film is hardly obtained from each of ZnO and $SnO_2$, an amorphous film can be obtained by adding about 20 at % of $In_2O_3$ to ZnO or by adding about 90 at % of $In_2O_3$ to $SnO_2$. In particular, about 0.1 Pa of nitrogen gas is desirably introduced into the atmosphere in order to obtain an Sn—In—O-based amorphous oxide film.

The above amorphous oxide film can has an additional element constituting a composite oxide of at least one element of a Group II element M2 having an atomic number smaller than that of Zn (M2 represents Mg or Ca); a Group III element M3 having an atomic number smaller than that of In (M3 represents B, Al, Ga, or Y); a Group IV element M4 having an atomic number smaller than that of Sn (M4 represents Si, Ge, or Zr); a Group V element M5 (M5 represents V, Nb, or Ta); Lu; and W.

The additional element can additionally stabilize the amorphous film at room temperature. In addition, the addition can expand the composition range in which the amorphous film can be obtained.

In particular, the addition of B, Si, or Ge having strong covalency is effective in stabilizing an amorphous phase, and a composite oxide composed of ions different from each other in ionic radius to a large extent has a stabilized amorphous phase.

For example, a stable amorphous oxide semiconductor film is hardly obtained at room temperature unless In accounts for more than about 20 at % of an In—Zn—O system. However, the addition of Mg in an amount equivalent to that of In can provide a stable amorphous oxide film when In accounts for more than about 15 at %.

An amorphous oxide semiconductor film having electron carrier concentration in excess of $10^{15}/cm^3$ and less than $10^{18}/cm^3$ can be obtained by controlling an atmosphere in film formation by means of a vapor phase method.

An amorphous oxide semiconductor is desirably formed into a film by means of any one of the vapor phase methods such as a pulse laser deposition method (PLD method), a sputtering method (an SP method), and an electron beam deposition method. Of those vapor phase methods, a PLD method is suitable because the composition of a material system can be easily controlled, and an SP method is suitable in terms of mass productivity. However, a film forming method is not limited to those methods.

(Formation of In—Zn—Ga—O-Based Amorphous Oxide Film by Means of PLD Method)

Polycrystalline sintered materials each having an $InGaO_3(ZnO)$ composition or an $InGaO_3(ZnO)_4$ composition were used as targets to deposit an In—Zn—Ga—O-based amorphous oxide film on a glass substrate (1737 manufactured by Corning Inc.) by means of a PLD method using a KrF excimer laser.

The film forming apparatus used was that shown in FIG. 14 described above, and film forming conditions were the same as those in the case where the apparatus was used.

The substrate temperature was 25° C. X-ray diffraction was conducted on each of the resultant films by means of small angle X-ray scattering method (SAXS; thin film method, angle of incidence 0.5 degree). As a result, no clear diffraction peak was detected. Therefore, each of the In—Zn—Ga—O-based films produced from two kinds of targets was found to be an amorphous film.

Furthermore, X-ray scattering measurement was performed on each of the In—Zn—Ga—O-based films on the glass substrate, and pattern analysis was performed. As a result, each of the thin films was found to have a mean square roughness (Rrms) of about 0.5 nm and a thickness of about 120 nm.

X-ray fluorescence (XRF) analysis confirmed that the metal composition ratio of the film obtained by using the polycrystalline sintered material having the $InGaO_3(ZnO)$ composition as a target was In:Ga:Zn=1.1:1.1:0.9 and the metal composition ratio of the film obtained by using the polycrystalline sintered material having the $InGaO(ZnO)_4$ composition as a target was In:Ga:Zn=0.98:1.02:4.

The electron carrier concentration of the amorphous oxide semiconductor film obtained by using the polycrystalline sintered material having the $InGaO_3(ZnO)_4$ composition as a target was measured with the oxygen partial pressure of the atmosphere during film formation changed. FIG. 1 shows the results. Film formation in an atmosphere having an oxygen partial pressure in excess of 4.2 Pa was able to reduce the electron carrier concentration to less than $10^{18}/cm^3$. In this case, the substrate had a temperature maintained at a temperature nearly equal to room temperature unless intentionally heated. When the oxygen partial pressure was less than 6.5 Pa, the surface of the resultant amorphous oxide film was flat.

When the oxygen partial pressure was 5 Pa, the amorphous oxide film obtained by using the polycrystalline sintered material having the $InGaO_3(ZnO)_4$ composition as a target had an electron carrier concentration of $10^{16}/cm^3$ and an electric conductivity of $10^{-2}$ S/cm. In addition, its electron mobility was estimated to be about 5 $cm^2/V·sec$. Owing to the analysis of a light absorption spectrum, the forbidden band energy width of the produced amorphous oxide film was determined to be about 3 eV.

Additionally increasing the oxygen partial pressure was able to additionally reduce the electron carrier concentration. As shown in FIG. 1, an In—Zn—Ga—O-based amorphous oxide film formed at a substrate temperature of 25° C. and an oxygen partial pressure of 6 Pa had an electron carrier concentration reduced to $8×10^{15}/cm^3$ (electric conductivity: about $8×10^{-3}$ S/cm). The electron mobility of the resultant film was estimated to be in excess of 1 $cm^2/(V·sec)$. However, in the PLD method, when the oxygen partial pressure was 6.5 Pa or more, the surface of the deposited film became irregular, so it became difficult to use the film as a channel layer of a TFT.

Investigation was made into the relationship between the electron carrier concentration and electron mobility of each of In—Zn—Ga—O-based amorphous oxide semiconductor films formed at different oxygen partial pressures by using the polycrystalline sintered material having the $InGaO_3(ZnO)_4$ composition as a target. FIG. 2 shows the results. It was found that the electron mobility increased from about 3 $cm^2/(V·sec)$ to about 11 $cm^2/(V·sec)$ as the electron carrier concentration increased from $10^{16}/cm^3$ to $10^{20}/cm^3$. A similar tendency was observed in an amorphous oxide film obtained by using the polycrystalline sintered material having the $InGaO_3(ZnO)$ composition as a target.

An In—Zn—Ga—O-based amorphous oxide semiconductor film obtained by using a polyethylene terephthalate (PET) film having a thickness of 200·m instead of a glass substrate also showed similar characteristics.

(Formation of In—Zn—Ga—Mg—O-Based Amorphous Oxide Film by Means of PLD Method)

A polycrystal InGaO$_3$(Zn$_{1-x}$Mg$_x$O)$_4$ (0<x·1) was used as a target to form an InGaO$_3$(Zn$_{1-x}$Mg$_x$O)$_4$ (0<x·1) film on a glass substrate by means of the PLD method.

The apparatus shown in FIG. 14 was used as a film forming apparatus.

An SiO$_2$ glass substrate (1737 manufactured by Corning Inc.) was prepared as a deposition substrate. The substrate was subjected to degreasing washing by means of an ultrasonic wave for 5 minutes in each of acetone, ethanol, and ultrapure water as a pretreatment, and then was dried in the air at 100° C. An InGa(Zn$_{1-x}$Mg$_x$O)$_4$ (x=1 to 0) sintered material (having a diameter of 20 mm and a thickness of 5 mm) was used as a target.

The target was produced by wet-mixing 4N reagents of In$_2$O$_3$, Ga$_2$O$_3$, ZnO, and MgO as starting materials in ethanol as a solvent; calcining the mixture at 1,000° C. for 2 hours; dry-pulverizing the resultant; and sintering the pulverized product at 1,550° C. for 2 hours. The ultimate pressure in the growth chamber was 2×10$^{-6}$ (Pa), and an oxygen partial pressure during growth was set to be 0.8 (Pa). The substrate temperature was room temperature (25° C.), and the distance between the target and the deposition substrate was 30 (mm).

The KrF excimer laser had a power of 1.5 (mJ/cm$^2$/pulse), a pulse width of 20 (nsec), a pulse rate of 10 (Hz), and an irradiation spot diameter of 1×1 (mm square).

The film-forming rate was 7 (nm/min).

The oxygen partial pressure of the atmosphere was 0.8 Pa, and the substrate temperature was 25° C. X-ray diffraction was conducted on the resultant film by means of small angle X-ray scattering method (SAXS; thin film method, angle of incidence 0.5 degree). As a result, no clear diffraction peak was detected. Therefore, the produced In—Zn—Ga—Mg—O-based film was found to be an amorphous film. The surface of the resultant film was flat.

Targets having different values of x were used to determine the x value dependence of each of the electric conductivity, electron carrier concentration, and electron mobility of the In—Zn—Ga—Mg—O-based amorphous oxide film formed in an atmosphere having an oxygen partial pressure of 0.8 Pa.

Figure 4:
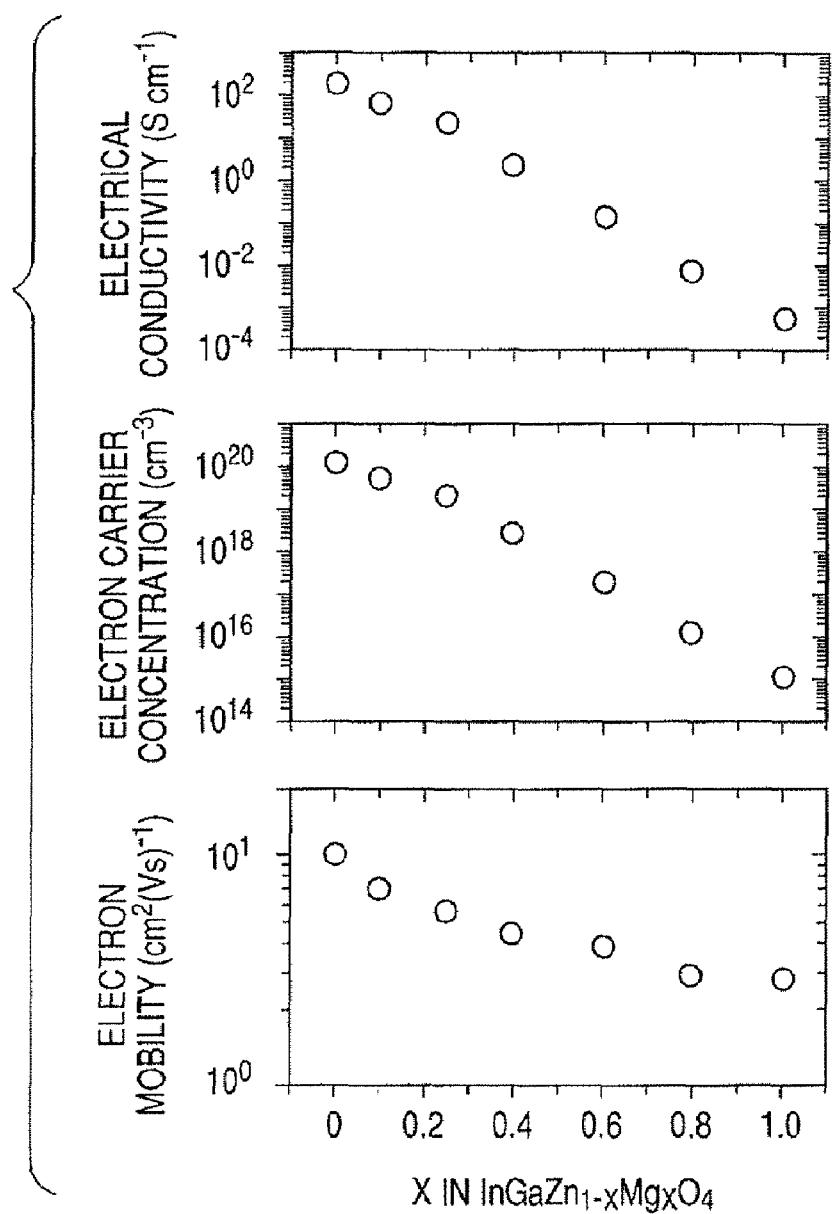
FIG. 4 shows graphs showing changes in electric conductivity, carrier concentration, and electron mobility with the value for x of $InGaO_3(Zn_{1-x}Mg_xO)$ formed into a film by means of a pulse laser deposition method in an atmosphere having an oxygen partial pressure of 0.8 Pa.

FIG. 4 shows the results. When the value of x exceeded 0.4, the electron carrier concentration of an amorphous oxide film formed by means of the PLD method in an atmosphere having an oxygen partial pressure of 0.8 Pa was found to be less than 10$^{18}$/cm$^3$. In addition, an amorphous oxide film having a value of x in excess of 0.4 had an electron mobility in excess of 1 cm$^2$/V sec.

As shown in FIG. 4, when a target obtained by replacing Zn with 80 at. % of Mg is used, the electron carrier concentration of a film obtained by means of a pulse laser deposition method in an atmosphere having an oxygen partial pressure of 0.8 Pa can be less than 10$^{16}$/cm$^3$ (the electrical resistance is about 10$^{-2}$ S/cm). The electron mobility of such film reduces as compared to a film with no additional Mg, but the degree of the reduction is small: the electron mobility at room temperature is about 5 cm$^2$/(V·sec), which is about one order of magnitude larger than that of amorphous silicon. Upon film formation under the same conditions, the electric conductivity and the electron mobility reduce with increasing Mg content. Therefore, the Mg content is preferably in excess of 20 at % and less than 85 at % (that is, 0.2<x<0.85), more preferably 0.5<x<0.85.

An InGaO$_3$(Zn$_{1-x}$Mg$_x$O)$_4$ (0<x·1) amorphous oxide film obtained by using a polyethylene terephthalate (PET) film having a thickness of 200·m instead of a glass substrate also showed similar characteristics.

(Formation of In$_2$O$_3$ Amorphous Oxide Film by Means of PLD Method)

An In$_2$O$_3$ polycrystalline sintered material was used as a target to form an In$_2$O$_3$ film on a PET film having a thickness of 200·m by means of the PLD method using a KrF excimer laser.

The apparatus shown in FIG. 14 was used. An SiO$_2$ glass substrate (1737 manufactured by Corning Inc.) was prepared as a deposition substrate.

The substrate was subjected to degreasing washing by means of an ultrasonic wave for 5 minutes in each of acetone, ethanol, and ultrapure water as a pretreatment, and then was dried in the air at 100° C.

An In$_2$O$_3$ sintered material (having a diameter of 20 mm and a thickness of 5 mm) was used as a target. The target was prepared by calcining a 4N reagent of In$_2$O$_3$ as a starting material at 1,000° C. for 2 hours; dry-pulverizing the resultant; and sintering the pulverized product at 1,550° C. for 2 hours.

The ultimate pressure in the growth chamber was 2×10$^{-6}$ (Pa), and the oxygen partial pressure during growth and the substrate temperature were set to be 5 (Pa) and room temperature, respectively.

The oxygen partial pressure and the vapor partial pressure were set to be 5 Pa and 0.1 Pa, respectively, and 200 W was applied to an oxygen-radical-generating apparatus to generate an oxygen radical.

The distance between the target and the deposition substrate was 40 (mm). The KrF excimer laser had a power of 0.5 (mJ/cm$^2$/pulse), a pulse width of 20 (nsec), a pulse rate of 10 (Hz), and an irradiation spot diameter of 1×1 (mm square).

The film forming rate was 3 (nm/min).

X-ray diffraction was conducted on the resultant film by means of an X-ray at an angle of incidence as close as the surface of the film (thin film method, angle of incidence 0.5 degree). As a result, no clear diffraction peak was detected. Therefore, the produced In—O-based film was found to be an amorphous film. The film had a thickness of 80 nm.

The resultant In—O-base amorphous oxide film had an electron carrier concentration of 5×10$^{17}$/cm$^3$ and an electron mobility of about 7 cm$^2$/V·sec.

(Formation of In—Sn—O-Based Amorphous Oxide Film by Means of PLD Method)

An (In$_{0.9}$Sn$_{0.1}$)O$_{3.1}$ polycrystalline sintered material was used as a target to form an In—Sn—O-based oxide film on a PET film having a thickness of 200·m by means of the PLD method using a KrF excimer laser.

To be specific, an SiO$_2$ glass substrate (1737 manufactured by Corning Inc.) was prepared as a deposition substrate.

The substrate was subjected to degreasing washing by means of an ultrasonic wave for 5 minutes in each of acetone, ethanol, and ultrapure water as a pretreatment. After that, the substrate was then dried in the air at 100° C.

An In$_2$O$_3$—SnO$_2$ sintered material (having a diameter of 20 mm and a thickness of 5 mm) was prepared as a target. The target was produced by wet-mixing a 4N reagent of In$_2$O$_3$—SnO$_2$ as a starting material in ethanol as a solvent; calcining the mixture at 1,000° C. for 2 hours; dry-pulverizing the resultant; and sintering the pulverized product at 1,550° C. for 2 hours.

The substrate temperature was room temperature. The oxygen partial pressure and the nitrogen partial pressure were set to be 5 (Pa) and 0.1 (Pa), respectively, and 200 W was applied to an oxygen-radical-generating apparatus to generate oxygen radical.

The distance between the target and the deposition substrate was 30 (mm). The KrF excimer laser had a power of 1.5 (mJ/cm$^2$/pulse), a pulse width of 20 (nsec), a pulse rate of 10 (Hz), and an irradiation spot diameter of 1×1 (mm square).

The film-forming rate was 6 (nm/min).

X-ray diffraction was conducted on the resultant film by means of small angle scattering method (SAXA; thin film method, angle of incidence 0.5 degree). As a result, no clear diffraction peak was detected. Therefore, the produced In—Sn—O-based film was found to be an amorphous film.

The resultant In—Sn—O amorphous oxide film had an electron carrier concentration of 8×10$^{17}$/cm$^3$, an electron mobility of about 5 cm$^2$/V·sec, and a thickness of 100 nm.

(Formation of In—Ga—O-Based Amorphous Oxide Film by Means of PLD Method)

An SiO$_2$ glass substrate (1737 manufactured by Corning Inc.) was prepared as a deposition substrate.

The substrate was subjected to degreasing washing by means of an ultrasonic wave for 5 minutes in each of acetone, ethanol, and ultrapure water as a pretreatment, and then was dried in the air at 100° C.

An (In$_2$O$_3$)$_{1-x}$—(Ga$_2$O$_3$)$_x$ (x=0 to 1) sintered material (having a diameter of 20 mm and a thickness of 5 mm) was prepared as a target. For example, in the case of x=0.1, the target is a (In$_{0.9}$Ga$_{0.1}$)$_2$O$_3$ polycrystalline sintered material.

The target was produced by wet-mixing a 4N reagent of In$_2$O$_3$—Ga$_2$O$_2$ as a starting material in ethanol as a solvent; calcining the mixture at 1,000° C. for 2 hours; dry-pulverizing the resultant; and sintering the pulverized product at 1,550° C. for 2 hours.

The ultimate pressure in the growth chamber was 2×10$^{-6}$ (Pa), and the oxygen partial pressure during growth was set to be 1 (Pa).

The substrate temperature was room temperature. The distance between the target and the deposition substrate was 30 (mm). The KrF excimer laser had a power of 1.5 (mJ/cm$^2$/pulse), a pulse width of 20 (nsec), a pulse rate of 10 (Hz), and an irradiation spot diameter of 1×1 (mm square). The film-forming rate was 6 (nm/min).

The substrate temperature was 25° C. The oxygen partial pressure was 1 Pa. X-ray diffraction was conducted on the resultant film by means of an X-ray at an angle of incidence as close as the surface of the film (thin film method, angle of incidence 0.5 degree). As a result, no clear diffraction peak was detected. Therefore, the produced In—Ga—O-based film was found to be an amorphous film. The film had a thickness of 120 nm.

The resultant In—Ga—O amorphous oxide film had an electron carrier concentration of 8×10$^{-6}$/cm$^3$ and an electron mobility of about 1 cm$^2$/V·sec.

(Production of TFT Device Using In—Zn—Ga—O-Based Amorphous Oxide Film (Glass Substrate))

Production of TFT Device

A top gate TFT device shown in FIG. 5 was produced.

At first, a polycrystalline sintered material having an InGaO$_3$(ZnO)$_4$ composition was used as a target to form an In—Ga—Zn—O-based amorphous oxide film on a glass substrate 1 at an oxygen partial pressure of 5 Pa by means of the above-described PLD apparatus. Thus, an In—Ga—Zn—O-based amorphous film having a thickness of 120 nm to be used as a channel layer 2 was formed.

An In—Ga—Zn—O-based amorphous film and a gold film each having a large electric conductivity and a thickness of 30 nm were laminated on the film by means of the PLD method with the oxygen partial pressure in the chamber set to be less than 1 Pa, to thereby form a drain terminal 5 and a source terminal 6 by means of a photolithography method and a lift-off method.

Finally, a Y$_2$O$_3$ film to be used as a gate insulation film 3 (thickness: 90 nm, relative dielectric constant: about 15, leak current density: 10$^{-3}$ A/cm$^2$ upon application of 0.5 MV/cm) was formed by means of an electron beam deposition method. A gold film was formed on the Y$_2$O$_3$ film, to thereby form a gate terminal 4 by means of a photolithography method and a lift-off method. The channel length was 50·m and the channel width was 200·m.

Evaluation of TFT Device for Characteristics

FIG. 6 shows the current-voltage characteristics of a TFT device measured at room temperature. The fact that a drain current I$_{DS}$ increased with increasing drain voltage V$_{DS}$ shows that the conduction of the channel is of an n-type.

This is not in contradiction to the fact that an amorphous In—Ga—Zn—O-based amorphous oxide film is an n-type conductor. I$_{DS}$ saturated (pinched off) at V$_{DS}$ of about 6 V. The saturation is a typical behavior of a semiconductor transistor. Investigation into a gain characteristic showed that the threshold value for a gate voltage V$_{GS}$ was about −0.5 V upon application of V$_{DS}$=4 V.

A current I$_{DS}$=1.0×10$^{-5}$ A flowed when V$_G$=10 V. This corresponds to the fact that a gate bias enabled a carrier to be induced in an In—Ga—Zn—O-based amorphous oxide film as an insulator.

The transistor had an on-off ratio in excess of 10$^3$. The field effect mobility was calculated from an output characteristic. As a result, a field effect mobility of about 7 cm$^2$(Vs)$^{-1}$ was obtained in the saturation region. The produced device was irradiated with visible light to perform similar measurement. However, no changes in transistor characteristics were observed.

An amorphous oxide having an electron carrier concentration of less than 10$^{18}$/cm$^3$ is applicable to a channel layer of a TFT. The electron carrier concentration was more preferably 10$^{17}$/cm$^3$ or less, or still more preferably 10$^{16}$/cm$^3$ or less.

(Production of TFT Device Using In—Zn—Ga—O-Based Amorphous Oxide Film (Amorphous Substrate))

A top gate TFT device shown in FIG. 5 was produced. At first, a polycrystalline sintered material having an InGaO$_3$(ZnO) composition was used as a target to form an In—Zn—Ga—O-based amorphous oxide film having a thickness of 120 nm to be used as a channel layer 2 on a polyethylene terephthalate (PET) film 1 at an oxygen partial pressure of 5 Pa by means of the PLD method.

An In—Zn—Ga—O-based amorphous oxide film and a gold film each having a large electric conductivity and a thickness of 30 nm were laminated on the film by means of the PLD method with the oxygen partial pressure in the chamber set to be less than 1 Pa, to thereby form a drain terminal 5 and a source terminal 6 by means of a photolithography method and a lift-off method. Finally, a gate insulation film 3 was formed by means of an electron beam deposition method, and a gold film was formed on the film to thereby form a gate terminal 4 by means of a photolithography method and a lift-off method. The channel length was 50·m and the channel width was 200·m. Each of Y$_2$O$_3$ (thickness: 140 nm), Al$_2$O$_3$ (thickness: 130·m), and HfO$_2$ (thickness: 140·m) was used as a gate insulation film to produce three kinds of TFT's each having the above structure.

Evaluation of TFT Device for Characteristics

The current-voltage characteristics of a TFT formed on the PET film measured at room temperature were the same as those shown in FIG. 6. That is, the fact that a drain current $I_{DS}$ increased with increasing drain voltage $V_{DS}$ shows that the conduction of the channel is of an n-type. This is not in contradiction to the fact that an amorphous In—Ga—Zn—O-based amorphous oxide film is an n-type conductor. $I_{DS}$ saturated (pinched off) at $V_{DS}$ of about 6 V. The saturation is a typical behavior of a transistor. A current $I_{ds}=10^{-8}$ A flowed when $V_g=0$, while a current $I_{DS}=2.0\times10^{-5}$ A flowed when $V_g=10$ V. This corresponds to the fact that a gate bias enabled an electron carrier to be induced in an In—Ga—Zn—O-based amorphous oxide film as an insulator.

The transistor had an on-off ratio in excess of $10^3$. The field effect mobility was calculated from an output characteristic. As a result, a field effect mobility of about 7 cm$^2$ (Vs)$^{-1}$ was obtained in a saturation region.

The device produced on the PET film was bent at a radius of curvature of 30 mm to perform similar measurement of transistor characteristics. However, no changes in transistor characteristics were observed. The device was irradiated with visible light to perform similar measurement. However, no changes in transistor characteristics were observed.

The TFT using an Al$_2$O$_3$ film as a gate insulation film showed transistor characteristics similar to those shown in FIG. 6. A current $I_{ds}=10^{-8}$ A flowed when $V_g=0$, while a current $I_{DS}=5.0\times10^{-6}$ A flowed when $V_g=10$ V. The transistor had an on-off ratio in excess of $10^2$. The field effect mobility was calculated from an output characteristic. As a result, a field effect mobility of about 2 cm$^2$ (Vs)$^{-1}$ was obtained in a saturation region.

The TFT using an HfO$_2$ film as a gate insulation film showed transistor characteristics similar to those shown in FIG. 6. A current $I_{ds}=10^{-8}$ A flowed when $V_g=0$, while a current $I_{DS}=1.0\times10^{-6}$ A flowed when $V_g=10$ V. The transistor had an on-off ratio in excess of $10^2$. The field effect mobility was calculated from an output characteristic. As a result, a field effect mobility of about 10 cm$^2$ (Vs)$^{-1}$ was obtained in a saturation region.

(Production of TFT Device Using In$_2$O$_3$ Amorphous Oxide Film by Means of PLD Method)

A top gate TFT device shown in FIG. 5 was produced. At first, an In$_2$O$_3$ amorphous oxide film having a thickness of 80 nm to be used as a channel layer 2 was formed on a polyethylene terephthalate (PET) film 1 by means of the PLD method.

Then, an In$_2$O$_3$ amorphous oxide film and a gold film each having a large electric conductivity and a thickness of 30 nm were laminated on the film by means of the PLD method with the oxygen partial pressure in the chamber set to be less than 1 Pa and a voltage to be applied to an oxygen-radical-generating apparatus set to zero, to thereby form a drain terminal 5 and a source terminal 6 by means of a photolithography method and a lift-off method. Finally, a Y$_2$O$_3$ film to be used as a gate insulation film 3 was formed by means of an electron beam deposition method, and a gold film was formed on the film to thereby form a gate terminal 4 by means of a photolithography method and a lift-off method.

Evaluation of TFT Device for Characteristics

The current-voltage characteristics of the TFT formed on the PET film were measured at room temperature. The fact that a drain current $I_{DS}$ increased with increasing drain voltage $V_{DS}$ shows that the channel is an n-type semiconductor. This is not in contradiction to the fact that an In—O-based amorphous oxide film is an n-type conductor. $I_{DS}$ saturated (pinched off) at $V_{DS}$ of about 5 V. The saturation is a typical behavior of a transistor. A current $I_{DS}=2\times10^{-8}$ A flowed when $V_g=0$ V, while a current $I_{DS}=2.0\times10^{-6}$ A flowed when $V_G=10$ V. This corresponds to the fact that a gate bias enabled an electron carrier to be induced in an In—O-based amorphous oxide film as an insulator.

The transistor had an on-off ratio of about $10^2$. The field effect mobility was calculated from an output characteristic. As a result, a field effect mobility of about 10 cm$^2$(Vs)$^{-1}$ was obtained in a saturation region. A TFT device produced on a glass substrate showed similar characteristics.

The device produced on the PET film was bent at a radius of curvature of 30 mm to perform similar measurement of transistor characteristics. However, no changes in transistor characteristics were observed.

(Production of TFT Device Using In—Sn—O-Based Amorphous Oxide Film by Means of PLD Method)

A top gate TFT device shown in FIG. 5 was produced. At first, an In—Sn—O-based amorphous oxide film having a thickness of 100 nm to be used as a channel layer 2 was formed on a polyethylene terephthalate (PET) film 1 by means of the PLD method. Then, an In—Sn—O-based amorphous oxide film and a gold film each having a large electric conductivity and a thickness of 30 nm were laminated on the film by means of the PLD method with the oxygen partial pressure in the chamber set to be less than 1 Pa and a voltage to be applied to an oxygen-radical-generating apparatus set to zero, to thereby form a drain terminal 5 and a source terminal 6 by means of a photolithography method and a lift-off method. Finally, a Y$_2$O$_3$ film to be used as a gate insulation film 3 was formed by means of an electron beam deposition method, and a gold film was formed on the film to thereby form a gate terminal 4 by means of a photolithography method and a lift-off method.

Evaluation of TFT Device for Characteristics

The current-voltage characteristics of the TFT formed on the PET film were measured at room temperature. The fact that a drain current $I_{DS}$ increased with increasing drain voltage $V_{DS}$ shows that the channel is an n-type semiconductor. This is not in contradiction to the fact that an In—Sn—O-based amorphous oxide film is an n-type conductor. $I_{DS}$ saturated (pinched off) at $V_{DS}$ of about 6 V. The saturation is a typical behavior of a transistor. A current $I_{DS}=5\times10^{-8}$ A flowed when $V_g=0$ V, while a current $I_{DS}=5.0\times10^{-5}$ A flowed when $V_G=10$ V. This corresponds to the fact that a gate bias enabled an electron carrier to be induced in an In—Sn—O-based amorphous oxide film as an insulator.

The transistor had an on-off ratio of about $10^3$. The field effect mobility was calculated from an output characteristic. As a result, a field effect mobility of about 5 cm$^2$ (Vs)$^{-1}$ was obtained in a saturation region. A TFT device produced on a glass substrate showed similar characteristics.

The device produced on the PET film was bent at a radius of curvature of 30 mm to perform similar measurement of transistor characteristics. However, no changes in transistor characteristics were observed.

(Production of TFT Device Using In—Ga—O-Based Amorphous Oxide Film by Means of PLD Method)

A top gate TFT device shown in FIG. 5 was produced. At first, an In—Ga—O-based amorphous oxide film having a thickness of 120 nm to be used as a channel layer 2 was formed on a polyethylene terephthalate (PET) film 1 by means of a film forming method shown in Example 6. Then, an In—Ga—O-based amorphous oxide film and a gold film each having a large electric conductivity and a thickness of 30 nm were laminated on the film by means of the PLD method with the oxygen partial pressure in the chamber set to be less than 1 Pa and the voltage to be applied to an oxygen-radicalgenerating apparatus set to zero, to thereby form a drain terminal 5 and a source terminal 6 by means of a photolithography method and a lift-off method. Finally, a $Y_2O_3$ film to be used as a gate insulation film 3 was formed by means of an electron beam deposition method, and a gold film was formed on the film to thereby form a gate terminal 4 by means of a photolithography method and a lift-off method.

Evaluation of TFT Device for Characteristics

The current-voltage characteristics of the TFT formed on the PET film were measured at room temperature. The fact that a drain current $I_{DS}$ increased with increasing drain voltage $V_{DS}$ shows that the channel is an n-type semiconductor. This is not in contradiction to the fact that an In—Ga—O-based amorphous oxide film is an n-type conductor. $I_{DS}$ saturated (pinched off) at $V_{DS}$ of about 6 V. The saturation is a typical behavior of a transistor. A current $I_{DS}=1\times10^{-8}$ A flowed when $V_g=0$ V, while a current $I_{DS}=1.0\times10^{-6}$ A flowed when $V_G=10$ V. This corresponds to the fact that a gate bias enabled an electron carrier to be induced in an In—Ga—O-based amorphous oxide film as an insulator.

The transistor had an on-off ratio of about $10^2$. A field effect mobility was calculated from an output characteristic. As a result, a field effect mobility of about 0.8 cm² (Vs)⁻¹ was obtained in a saturation region. A TFT device produced on a glass substrate showed similar characteristics.

The device produced on the PET film was bent at a radius of curvature of 30 mm to perform similar measurement of transistor characteristics. However, no changes in transistor characteristics were observed.

An amorphous oxide semiconductor having an electron carrier concentration of less than $10^{18}/cm^3$ is applicable to a channel layer of a TFT. The electron carrier concentration was more preferably $10^{17}/cm^3$ or less, or still more preferably $10^{16}/cm^3$ or less.

Figure 7:
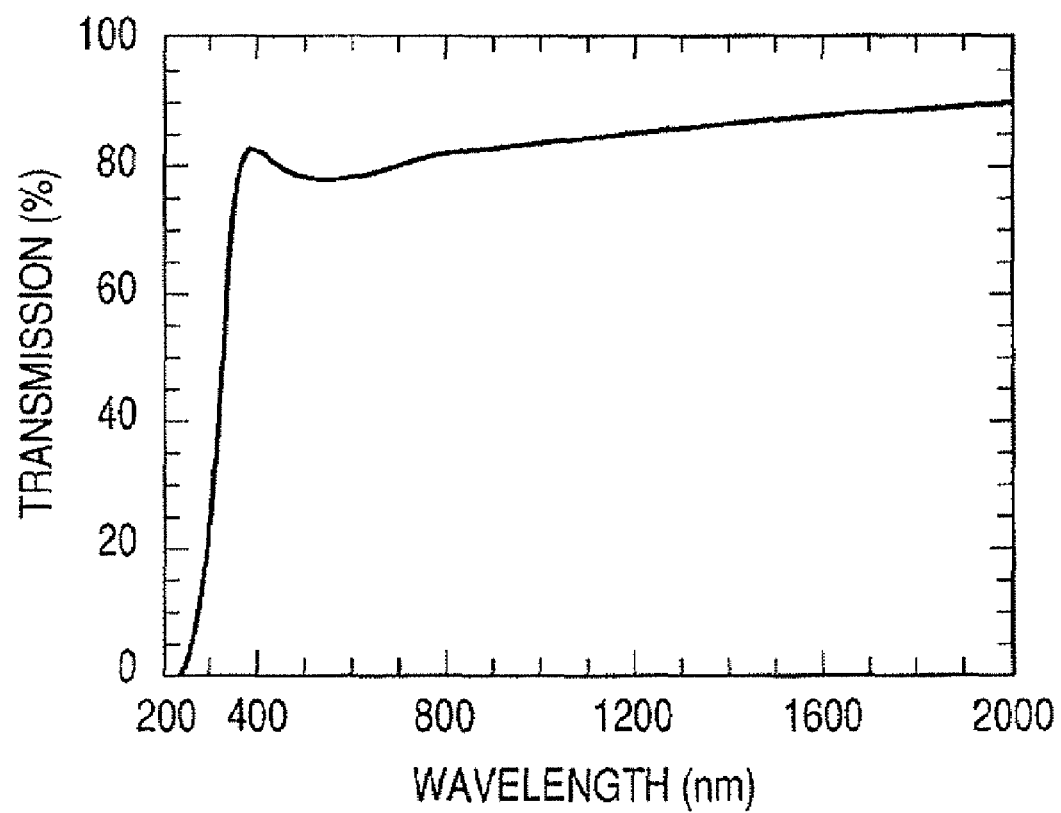
FIG. 7 is a graph showing the transmittance of an amorphous semiconductor layer (200 nm) constituted by In—Ga—Zn—O.

FIG. 7 shows the transmittance of an amorphous oxide semiconductor layer (200 nm in thickness) constituted of In—Ga—Zn—O and having a composition in a crystalline state represented by $InGaO_3(Zn)_m$ (where m represents a natural number of less than 6). The band gap is about 3 eV. This layer has a strong sensitivity particularly to the ultraviolet light that has a wavelength shorter than 400 nm and has a transmission of 60% or less. An amorphous oxide semiconductor layer constituted of In—Ga—Zn—Mg—O and having a composition in a crystalline state represented by $InGaO_3(Zn_{1-x}Mg_xO)_m$ (where m represents a natural number of less than 6 and 0<x·1) shows a similar transmittance, and shows sensitivity to ultraviolet light.

In addition, the use of an organic pigment can expand the light sensitivity wavelength range of an amorphous oxide semiconductor mainly composed of In—Ga—Zn—O having a large electron mobility from an ultraviolet wavelength range to a visible light wavelength range, and causes the semiconductor to show high opto-electric conversion efficiency.

Hereinafter, examples will be shown.

EXAMPLE 1

An optical sensor device shown in FIG. 8 is formed. An Al electrode having a thickness of 100 nm is formed on a glass substrate (1737 manufactured by Corning Inc.) by means of a vacuum deposition method to serve as a lower electrode. Next, a polycrystalline sintered material having an $InGaO_3(ZnO)_4$ composition is used as a target to deposit an In—Ga—Zn—O-based amorphous oxide semiconductor thin film on the electrode by means of a pulse laser deposition method using a Kr excimer laser. $In_2O_3(SnO_2)$ having a thickness of about 20 nm is laminated on the thin film at a substrate temperature of room temperature by means of a vacuum deposition method to serve as an upper electrode. Thus, an optical sensor is formed. At the time of use, a negative bias is applied to the upper electrode on a light incidence side, and a positive bias is applied to the lower electrode. Then, the optical sensor device is irradiated with ultraviolet light having a wavelength of 365 nm from a mercury lamp. Thus, it can be confirmed that the device functions as an ultraviolet optical sensor.

EXAMPLE 2

An optical sensor device shown in FIG. 8 is formed. An Al electrode having a thickness of 100 nm is formed on a glass substrate (1737 manufactured by Corning Inc.) by means of a vacuum deposition method to serve as a lower electrode. Next, a polycrystalline sintered material having an $InGaO_3(Zn_{0.9}Mg_{0.1}O)_4$ composition is used as a target to deposit an In—Ga—Zn—O-based amorphous oxide semiconductor thin film on the electrode by means of a pulse laser deposition method using a Kr excimer laser. The thickness of the amorphous oxide semiconductor film formed is 100 nm. $In_2O_3(SnO_2)$ having a thickness of about 20 nm is laminated on the thin film at a substrate temperature of room temperature by means of a vacuum deposition method to serve as an upper electrode. A voltage of 1 V is applied to the optical sensor device thus formed. At the time of use, a negative bias is applied to the upper electrode on a light incidence side, and a positive bias is applied to the lower electrode. Then, the optical sensor device is irradiated with ultraviolet light having a wavelength of 365 nm from a mercury lamp. Thus, it can be confirmed that the device functions as an ultraviolet optical sensor.

EXAMPLE 3

An optical sensor device shown in FIG. 9 is formed. An Al electrode having a thickness of 100 nm is formed on a glass substrate (1737 manufactured by Corning Inc.) by means of a vacuum deposition method to serve as a lower electrode. A polycrystalline sintered material having an $InGaO_3(Zn_{0.9}Mg_{0.1}O)_4$ composition is used as a target to deposit an In—Ga—Zn—O-based amorphous oxide semiconductor thin film having a thickness of 5 nm on the electrode by means of a pulse laser deposition method using a Kr excimer laser. Next, a polycrystalline sintered material having an $InGaO_3(ZnO)_4$ composition is used as a target to deposit an In—Ga—Zn—O-based amorphous oxide semiconductor thin film having a thickness of 5 nm. This operation is repeated 20 times to laminate a semiconductor layer having a multilayer structure (200 nm in thickness). The total thickness of the amorphous oxide semiconductor films formed is 100 nm. $In_2O_3(SnO_2)$ having a thickness of about 20 nm is laminated on the semiconductor layer at a substrate temperature of room temperature by means of a vacuum deposition method to serve as an upper electrode.

EXAMPLE 4

In the optical sensor device shown in Example 1, the amorphous oxide semiconductor having a thickness of 100 nm is laminated, and is then immersed in a pigment solution prepared by dissolving 0.01% of a cyanine pigment into a mixed solution of methanol and chloroform to cause the organic pigment to adsorb and bond to the semiconductor. After the organic solvent has been volatilized, $In_2O_3(SnO_2)$ having a thickness of about 20 nm is laminated on the remainder at a substrate temperature of room temperature by means of a vacuum deposition method to serve as an upper electrode. A voltage of 1 V is applied to the optical sensor device thus formed. A negative bias is applied to the upper electrode on a light incidence side, and a positive bias is applied to the lower electrode. Then, the optical sensor device is irradiated with ultraviolet light having a wavelength of 365 nm from a mercury lamp. Thus, it can be confirmed that the device functions as an ultraviolet optical sensor.

EXAMPLE 5

An optical sensor device shown in FIG. 9 is formed. An Al electrode having a thickness of 100 nm is formed on a glass substrate (1737 manufactured by Corning Inc.) by means of a vacuum deposition method to serve as a lower electrode. A polycrystalline sintered material having an $InGaO_3(Zn_{0.9}Mg_{0.1}O)_4$ composition is used as a target to deposit an In—Ga—Zn—O-based amorphous oxide semiconductor thin film having a thickness of 5 nm on the electrode by means of a pulse laser deposition method using a Kr excimer laser. Next, a polycrystalline sintered material having an $InGaO_3(ZnO)_4$ composition is used as a target to deposit an In—Ga—Zn—O-based amorphous oxide semiconductor thin film having a thickness of 5 nm. This operation is repeated 20 times to laminate a semiconductor layer having a multilayer structure (200 nm in thickness). A voltage of 1 V is applied to the optical sensor device thus formed. A negative bias is applied to the upper electrode on a light incidence side, and a positive bias is applied to the lower electrode. Then, the optical sensor device is irradiated with ultraviolet light having a wavelength of 365 nm from a mercury lamp. Thus, it can be confirmed that the device functions as an ultraviolet optical sensor.

EXAMPLE 6

A top gate MISFET device shown in FIG. 5 is produced as a TFT of a non-flat imager.

A polyimide sheet having a thickness of 0.3 mm is used as a substrate.

A polycrystalline sintered material having an $InGaO_3(ZnO)_4$ composition is used as a target to deposit an In—Ga—Zn—O-based amorphous oxide semiconductor thin film on the polyimide sheet by means of a pulse laser deposition method using a KrF excimer laser. Thus, an $InGaO_3(ZnO)_4$ amorphous oxide semiconductor thin film having a thickness of 120 nm to be used as a channel layer is formed. Furthermore, $InGaO_3(ZnO)_4$ and a gold film each having a large electric conductivity and a thickness of 30 nm are laminated on the film by means of a pulse laser deposition method with the oxygen partial pressure in a chamber set to be less than 1 Pa, to thereby form a drain terminal and a source terminal by means of a photolithography method and a lift-off method. Finally, a $Y_2O_3$ film to be used as a gate insulation film (thickness: 90 nm, relative dielectric constant: about 15, leak current density: $10^{-3}$ A/cm$^2$ upon application of 0.5 MV/cm) is formed by means of an electron beam deposition method. A gold film is formed on the $Y_2O_3$ film, to thereby form a gate terminal by means of a photolithography method and a lift-off method.

An optical sensor device shown in FIG. 8 is formed as a sensor of a non-flat imager. An Al electrode having a thickness of 100 nm is formed on the polyimide substrate by means of a vacuum deposition method to serve as a lower electrode. Next, a polycrystalline sintered material having an $InGaO_3(ZnO)_4$ composition is used as a target to deposit an In—Ga—Zn—O-based amorphous oxide semiconductor thin film on the electrode by means of a pulse laser deposition method using a Kr excimer laser. The thickness of the amorphous oxide semiconductor film formed is 100 nm. The amorphous oxide semiconductor is immersed in a pigment solution prepared by dissolving 0.01% of a cyanine pigment into a mixed solution of methanol and chloroform to cause the organic pigment to adsorb and bond to the semiconductor.

$In_2O_3(SnO_2)$ having a thickness of about 20 nm is laminated on the thin film at a substrate temperature of room temperature by means of a vacuum deposition method to serve as an upper electrode. A $CdWO_4$ layer having a thickness of 400·m to serve as a scintillator is deposited on the upper electrode by means of a sputtering method. Then, an X-ray sensor shown in FIG. 10 is formed. Such TFT and X-ray sensor are combined to form a circuit shown in FIG. 11, thereby constituting a non-flat imager shown in FIG. 12. A small digital camera to serve a measuring object is placed in such non-flat imager to perform X-ray measurement. An image having reduced distortion as compared to that of an image obtained by using a conventional flat X-ray imager can be obtained.

EXAMPLE 7

A top gate MISFET device shown in FIG. 5 is produced as a TFT of a non-flat imager. A plastic sheet having a thickness of 0.3 mm is used as a substrate. A polycrystalline sintered material having an $InGaO_3(Zn_{0.9}Mg_{0.1}O)_4$ composition is used as a target to deposit an In—Ga—Zn—O-based amorphous oxide semiconductor thin film on the plastic sheet by means of a pulse laser deposition method using a KrF excimer laser. Thus, an $InGaO_3(Zn_{0.9}Mg_{0.1}O)_4$ amorphous oxide semiconductor thin film having a thickness of 120 nm to be used as a channel layer is formed. Furthermore, $InGaO_3(Zn_{0.9}Mg_{0.1}O)_4$ and a gold film each having a large electric conductivity and a thickness of 30 nm are laminated on the film by means of a pulse laser deposition method with the oxygen partial pressure in the chamber set to be less than 1 Pa, to thereby form a drain terminal and a source terminal by means of a photolithography method and a lift-off method. Finally, a $Y_2O_3$ film to be used as a gate insulation film (thickness: 90 nm, relative dielectric constant: about 15, leak current density:$10^{-1}$ A/cm$^2$ upon application of 0.5 MV/cm) is formed by means of an electron beam deposition method. A gold film is formed on the $Y_2O_3$ film, to thereby form a gate terminal by means of a photolithography method and a lift-off method.

An optical sensor device shown in FIG. 9 is formed as a sensor of a non-flat imager. An Al electrode having a thickness of 100 nm is formed on the plastic substrate by means of a vacuum deposition method to serve as a lower electrode. A polycrystalline sintered material having an $InGaO_3(Zn_{0.9}Mg_{0.1}O)_4$ composition is used as a target to deposit an In—Ga—Zn—O-based amorphous oxide semiconductor thin film having a thickness of 5 nm on the electrode by means of a pulse laser deposition method using a Kr excimer laser. Next, a polycrystalline sintered material having an $InGaO_3(ZnO)_4$ composition is used as a target to deposit an In—Ga—Zn—O-based amorphous oxide semiconductor thin film having a thickness of 5 nm. This operation is repeated 20 times to laminate a semiconductor layer having a multilayer structure (200 nm in thickness). The total thickness of the amorphous oxide semiconductor films formed is 100 nm. Every time each oxide semiconductor layer is laminated, a phthalocyanine pigment is vacuum-deposited to laminate about a monomolecular film of the pigment on the oxide semiconductor layer. In$_2$O$_3$(SnO$_2$) having a thickness of about 20 nm is laminated on the resultant at a substrate temperature of room temperature by means of a vacuum deposition method to serve as an upper electrode.

Such TFT and X-ray sensor are combined to form a circuit shown in FIG. 11, thereby constituting a non-flat imager shown in FIG. 12. A small digital camera to serve a measuring object is placed in such non-flat imager to perform X-ray measurement. An image having reduced distortion as compared to that of an image obtained by using a conventional flat X-ray imager can be obtained.

The present invention is applicable to a sensor and a non-flat imager each having high sensitivity to ultraviolet light, visible light, and an X-ray.

This application claims priority from Japanese Patent Application No. 2004-326681 filed Nov. 10, 2004, which is hereby incorporated by reference herein.

What is claimed is:

1. A sensor for detecting a received electromagnetic wave, comprising:
   a first electrode;
   a second electrode; and
   an amorphous oxide layer interposed between the first electrode and the second electrode, wherein the amorphous oxide layer comprises an oxide selected from the group consisting of an oxide containing In, Zn and Sn, an oxide containing In and Zn, an oxide containing In and Sn, and an oxide containing In.

2. A sensor for detecting a received electromagnetic wave, comprising:
   a first electrode;
   a second electrode; and
   an amorphous oxide layer interposed between the first electrode and the second electrode, wherein the amorphous oxide layer has an electron carrier concentration of less than $10^{18}$/cm$^3$.

3. A sensor for detecting a received electromagnetic wave, comprising:
   a first electrode;
   a second electrode; and
   an amorphous oxide layer interposed between the first electrode and the second electrode, wherein the amorphous oxide layer contains In, Ga, and Zn.

4. A sensor for detecting a received electromagnetic wave, comprising:
   a first electrode;
   a second electrode; and
   an amorphous oxide layer interposed between the first electrode and the second electrode,
   wherein the amorphous oxide layer comprises an amorphous oxide whose electron mobility tends to increase with increasing electron carrier concentration.

* * * * *